United States Patent
Lyon et al.

(10) Patent No.: US 10,820,450 B2
(45) Date of Patent: *Oct. 27, 2020

(54) MODULAR HEAT-TRANSFER SYSTEMS

(71) Applicant: COOLIT SYSTEMS, INC., Calgary (CA)

(72) Inventors: Geoff Sean Lyon, Calgary (CA); Mike Holden, Calgary (CA); Brydon Gierl, Calgary (CA)

(73) Assignee: CoolIT Systems, Inc., Calgary (CA)

( * ) Notice: Subject to any disclaimer, the term of this patent is extended or adjusted under 35 U.S.C. 154(b) by 440 days.

This patent is subject to a terminal disclaimer.

(21) Appl. No.: 15/351,362

(22) Filed: Nov. 14, 2016

(65) Prior Publication Data

US 2017/0064874 A1    Mar. 2, 2017

Related U.S. Application Data

(63) Continuation of application No. 13/559,340, filed on Jul. 26, 2012, now Pat. No. 9,496,200, which is a
(Continued)

(51) Int. Cl.
*H05K 7/20* (2006.01)
*H01L 23/473* (2006.01)

(52) U.S. Cl.
CPC ....... *H05K 7/20781* (2013.01); *H01L 23/473* (2013.01); *H01L 2924/0002* (2013.01);
(Continued)

(58) Field of Classification Search
CPC ........... H05K 7/20218; H05K 7/20272; H05K 7/20281; H05K 7/20627; H05K 7/20763; H05K 7/20781; H01L 23/473
(Continued)

(56) References Cited

U.S. PATENT DOCUMENTS 3,481,393 A   12/1969   Chu
3,792,284 A   2/1974   Kaelin
(Continued)

FOREIGN PATENT DOCUMENTS

JP   61032449   2/1986
JP   2002151638   5/2002
(Continued)

OTHER PUBLICATIONS

Vertal, L., "Water Cooling Comes of Age, Again," Asetek Data Center Liquid Cooling, Published on Oct. 11, 2013, Retrieved from the Internet URL: https://www.asetek.com/press-room/blog/2013/water-cooling-comes-of-age-again/, on Jan. 4, 2018, pp. 1-10.
(Continued)

*Primary Examiner* — Paul Alvare
(74) *Attorney, Agent, or Firm* — Ganz Pollard, LLC

(57) ABSTRACT

Some modular heat-transfer systems can have an array of at least one heat-transfer element being configured to transfer heat to a working fluid from an operable element. A manifold module can have a distribution manifold and a collection manifold. A decoupleable inlet coupler can be configured to fluidicly couple the distribution manifold to a respective heat-transfer element. A decoupleable outlet coupler can be configured to fluidicly couple the respective heat-transfer element to the collection manifold. An environmental coupler can be configured to receive the working fluid from the collection manifold, to transfer heat to an environmental fluid from the working fluid or to transfer heat from an environmental fluid to the working fluid, and to discharge the working fluid to the distribution manifold.

13 Claims, 12 Drawing Sheets

Related U.S. Application Data continuation-in-part of application No. 13/401,618, filed on Feb. 21, 2012, now Pat. No. 9,453,691.

(60) Provisional application No. 61/622,982, filed on Apr. 11, 2012, provisional application No. 61/522,247, filed on Aug. 11, 2011, provisional application No. 61/512,379, filed on Jul. 27, 2011.

(52) U.S. Cl.
CPC ..... *H05K 7/20218* (2013.01); *H05K 7/20272* (2013.01); *H05K 7/20627* (2013.01); *H05K 7/20763* (2013.01)

(58) Field of Classification Search
USPC .................................. 165/144; 361/699, 701
See application file for complete search history.

(56) References Cited

U.S. PATENT DOCUMENTS

| | | |
|---|---|---|
| 4,561,040 A | 12/1985 | Eastman et al. |
| 4,564,040 A | 1/1986 | Rudelick |
| 4,750,086 A | 6/1988 | Mittal |
| 4,898,153 A | 2/1990 | Sherwood |
| 4,909,315 A | 3/1990 | Nelson et al. |
| 4,940,085 A | 7/1990 | Nelson et al. |
| 5,265,670 A | 11/1993 | Zingher |
| 5,294,830 A | 3/1994 | Young et al. |
| 5,309,319 A | 5/1994 | Messina |
| 5,535,818 A | 7/1996 | Fujisaki et al. |
| 5,646,824 A | 7/1997 | Ohashi et al. |
| 5,684,671 A | 11/1997 | Hobbs et al. |
| 5,727,618 A | 3/1998 | Mundinger et al. |
| 5,823,249 A | 10/1998 | Batchelder |
| 6,019,165 A | 2/2000 | Baechelder |
| 6,256,378 B1 | 7/2001 | Iggulden et al. |
| 6,327,145 B1 | 12/2001 | Lian et al. |
| 6,330,525 B1 | 12/2001 | Hays et al. |
| 6,415,860 B1 | 7/2002 | Kelly et al. |
| 6,447,270 B1 | 9/2002 | Schmidt et al. |
| 6,470,289 B1 | 10/2002 | Peters et al. |
| 6,702,002 B2 | 3/2004 | Wang |
| 6,792,373 B2 | 9/2004 | Tabor |
| 6,679,315 B2 | 10/2004 | Cosley et al. |
| 6,819,563 B1 | 11/2004 | Chu et al. |
| 6,952,345 B2 | 10/2005 | Weber et al. |
| 6,973,801 B1 | 12/2005 | Campbell et al. |
| 7,000,684 B2 | 2/2006 | Kenny et al. |
| 7,007,506 B2 | 3/2006 | Kubo et al. |
| 7,012,807 B2 | 3/2006 | Chu |
| 7,021,367 B2 | 4/2006 | Oikawa |
| 7,044,198 B2 | 5/2006 | Matsushima et al. |
| 7,057,893 B2 | 6/2006 | Nicolai et al. |
| 7,086,247 B2 | 8/2006 | Campbell et al. |
| 7,104,312 B2 | 9/2006 | Goodson et al. |
| 6,986,382 B2 | 10/2006 | Kenny et al. |
| 6,988,534 B2 | 10/2006 | Kenny et al. |
| 7,123,996 B2 | 10/2006 | Fukushima et al. |
| 7,124,811 B2 | 10/2006 | Crocker et al. |
| 7,131,486 B2 | 11/2006 | Goodson et al. |
| 7,149,084 B2 | 12/2006 | Matsushima |
| 7,156,159 B2 | 1/2007 | Lovette et al. |
| 7,209,355 B2 | 4/2007 | Koga et al. |
| 7,221,270 B2 | 5/2007 | Chen et al. |
| 7,264,359 B2 | 9/2007 | Kawahara et al. |
| 7,274,566 B2 | 9/2007 | Campbell et al. |
| 7,278,273 B1 | 10/2007 | Whitted et al. |
| 7,301,771 B2 | 11/2007 | Hata et al. |
| 7,315,448 B1 | 1/2008 | Bash et al. |
| 7,318,322 B2 | 1/2008 | Ota et al. |
| 7,397,661 B2 | 7/2008 | Campbell et al. |
| 7,466,549 B2 | 12/2008 | Dorrich et al. |
| 7,466,553 B2 | 12/2008 | Hamman |
| 7,484,530 B2 | 2/2009 | Harvey et al. |
| 7,527,085 B2 | 5/2009 | Iijima et al. |
| 7,591,302 B1 | 9/2009 | Lenehan et al. |
| 7,599,184 B2 | 10/2009 | Upadhya et al. |
| 7,639,499 B1 | 12/2009 | Campbell et al. |
| 7,688,589 B2 | 3/2010 | Chiang |
| 7,757,506 B2 * | 7/2010 | Ellsworth, Jr. ...... H05K 7/2079 165/80.4 |
| 7,762,314 B2 | 7/2010 | Campbell et al. |
| 7,791,882 B2 | 9/2010 | Chu et al. |
| 7,905,106 B2 * | 3/2011 | Attlesey .................. G06F 1/20 165/104.33 |
| 7,925,746 B1 | 4/2011 | Melton |
| 7,944,694 B2 | 6/2011 | Campbell et al. |
| 7,957,144 B2 | 6/2011 | Goettert et al. |
| 7,961,465 B2 | 6/2011 | Goldrian et al. |
| 7,969,727 B2 | 7/2011 | Tozer et al. |
| 7,971,632 B2 | 7/2011 | Eriksen et al. |
| 7,978,472 B2 | 7/2011 | Campbell et al. |
| 8,066,057 B2 | 11/2011 | Olesen et al. |
| 8,240,362 B2 | 8/2012 | Eriksen |
| 8,245,764 B2 | 8/2012 | Eriksen |
| 8,427,831 B2 | 4/2013 | Wei |
| 8,437,129 B2 | 5/2013 | Tung et al. |
| 8,441,789 B2 | 5/2013 | Wu et al. |
| 8,493,738 B2 | 7/2013 | Chainer et al. |
| 8,724,315 B2 | 5/2014 | Branton |
| 9,052,252 B2 | 6/2015 | Lyon |
| 2002/0070007 A1 | 6/2002 | Calaman et al. |
| 2002/0153885 A1 | 10/2002 | Blossfeld |
| 2003/0019234 A1 | 1/2003 | Wayburn et al. |
| 2004/0008483 A1 * | 1/2004 | Cheon ...................... G06F 1/20 361/679.53 |
| 2004/0042171 A1 | 3/2004 | Takamatsu et al. |
| 2004/0042172 A1 | 3/2004 | Kusaka et al. |
| 2004/0057211 A1 | 3/2004 | Kondo et al. |
| 2004/0100770 A1 * | 5/2004 | Chu ................... H05K 7/20754 361/698 |
| 2004/0104010 A1 | 6/2004 | Kenny et al. |
| 2004/0104012 A1 | 6/2004 | Zhou et al. |
| 2004/0104022 A1 | 6/2004 | Kenny et al. |
| 2004/0112585 A1 | 6/2004 | Goodson et al. |
| 2004/0123614 A1 | 7/2004 | Stewart |
| 2004/0182548 A1 | 9/2004 | Lovette et al. |
| 2004/0188069 A1 | 9/2004 | Tomioka et al. |
| 2004/0206477 A1 | 10/2004 | Kenny et al. |
| 2004/0221604 A1 | 11/2004 | Ota |
| 2004/0240179 A1 | 12/2004 | Koga et al. |
| 2005/0126747 A1 | 6/2005 | Chu |
| 2005/0128705 A1 | 6/2005 | Chu |
| 2005/0180107 A1 | 8/2005 | Naganawa et al. |
| 2005/0259397 A1 | 11/2005 | Bash |
| 2005/0269061 A1 | 12/2005 | Brewer et al. |
| 2006/0002080 A1 | 1/2006 | Leija |
| 2006/0094347 A1 | 5/2006 | Tracy et al. |
| 2006/0143439 A1 | 6/2006 | Arumugam et al. |
| 2006/0187638 A1 | 8/2006 | Vinson et al. |
| 2006/0225867 A1 | 10/2006 | Park et al. |
| 2007/0039719 A1 | 2/2007 | Eriksen et al. |
| 2007/0163750 A1 | 7/2007 | Bhatti et al. |
| 2007/0227710 A1 | 10/2007 | Belady et al. |
| 2007/0256957 A1 | 11/2007 | Herrmann et al. |
| 2007/0272314 A1 | 11/2007 | Packham |
| 2007/0297136 A1 | 12/2007 | Konshak |
| 2008/0225478 A1 | 9/2008 | Goettert et al. |
| 2008/0288124 A1 | 11/2008 | Huang |
| 2008/0304236 A1 * | 12/2008 | Murakami ............. H05K 7/207 361/699 |
| 2009/0071625 A1 | 3/2009 | Lyon |
| 2009/0120622 A1 | 5/2009 | Koch |
| 2009/0154096 A1 | 6/2009 | Iyengar et al. |
| 2009/0218072 A1 | 9/2009 | Erikson |
| 2009/0228893 A1 | 9/2009 | Behrendt et al. |
| 2009/0322543 A1 | 12/2009 | Crnkovich et al. |
| 2010/0085708 A1 | 4/2010 | Martin et al. |
| 2010/0101765 A1 | 4/2010 | Campbell |
| 2010/0103620 A1 | 4/2010 | Campbell |
| 2010/0139887 A1 | 6/2010 | Slessman |
| 2010/0179695 A1 | 7/2010 | Collins et al. |
| 2010/0211669 A1 | 8/2010 | Dalgas et al. |

(56) References Cited

U.S. PATENT DOCUMENTS

| | | |
|---|---|---|
| 2010/0324962 A1 | 12/2010 | Nesler et al. |
| 2011/0084839 A1 | 4/2011 | Groth et al. |
| 2011/0100045 A1 | 5/2011 | Carlson |
| 2011/0100618 A1 | 5/2011 | Carlson |
| 2011/0127027 A1 | 6/2011 | Kashirajima et al. |
| 2011/0154842 A1 | 6/2011 | Heydari et al. |
| 2011/0168379 A1 | 7/2011 | Morgan et al. |
| 2011/0174001 A1 | 7/2011 | Carlson et al. |
| 2011/0175498 A1 | 7/2011 | Bash et al. |
| 2011/0303394 A1 | 12/2011 | Branton |
| 2011/0313576 A1* | 12/2011 | Nicewonger ........... F28D 15/00 700/282 |
| 2012/0147553 A1 | 6/2012 | Eriksen |
| 2012/0271567 A1 | 10/2012 | Da Pont et al. |
| 2012/0273159 A1 | 11/2012 | Eriksen |
| 2013/0025818 A1 | 1/2013 | Lyon et al. |
| 2014/0186156 A1 | 7/2014 | Lai et al. |
| 2014/0266744 A1 | 9/2014 | Lyon |
| 2015/0168474 A1 | 6/2015 | Yoshioka et al. |
| 2015/0355630 A1 | 12/2015 | Cader |
| 2016/0281704 A1 | 9/2016 | Lyon |

FOREIGN PATENT DOCUMENTS

| | | |
|---|---|---|
| JP | 2007180505 | 7/2007 |
| JP | 2007227902 | 9/2007 |
| JP | 2007531991 | 11/2007 |
| WO | 0165900 A1 | 9/2001 |
| WO | 03055055 A1 | 7/2003 |

OTHER PUBLICATIONS

Non-Final Office Action dated Mar. 26, 2015, for U.S. Appl. No. 13/559,340, of Lyon, G.S., et al., filed Jul. 26, 2012.

Final Office Action dated Sep. 8, 2015, for U.S. Appl. No. 13/559,340, of Lyon, G.S., et al., filed Jul. 26, 2012.

Non-Final Office Action dated Jan. 15, 2016, for U.S. Appl. No. 13/559,340, of Lyon, G.S., et al., filed Jul. 26, 2012.

Non-Final Office Action in U.S. Appl. No. 14/777,510, dated Apr. 23, 2018, 23 pages.

Non-Final Office Action in U.S. Appl. No. 15/354,982, dated May 8, 2018, 19 pages.

Technical Opinion dated Jan. 10, 2013, in Japanese Registration No. 3179086 (Utility Model Application No. 2012-002117); accompanied by English translation; 7 pages.

Office Action for U.S. Appl. No. 12/189,476 dated Apr. 13, 2012; 17 pages.

Final Office Action for U.S. Appl. No. 12/189,476 dated Jan. 7, 2013; 10 pages.

Gabriel Torres, CoolIT Water-Cooling Products, http://hardwaresecrets.com/printpage/CoolIT-Water-Cooling-Products/515, Jan. 14, 2008, printed from the web Apr. 24, 2014; 9 pages.

Michael J. Ellsworth, JR. P.E., Thermal Design and Implementation of Robust Liquid Cooling Systems for High Performance Computer Systems, Systems Technology Group, IBM, InterPACK '11, Jul. 6-8, 2011.

Roger R. Schmidt, Liquid Cooling is Back, Aug. 1, 2005; https://www.electronics-cooling.com/2005/08/liquid-cooling-is-back/; 8 pages.

Ellsworth, Jr. et al., The Evolution of Water Cooling for IBM Large Server Systems: Back to the Future, IEEE, 2008, 9 pages.

Petition for Inter Partes Review of U.S. Pat. No. 8,749,968; United States Patent and Trademark Office, Before the Patent Trial and Appeal Board, *CoolIT Systems, Inc.* v. *Asetek A/S*, Inter Partes Review No. 2014-01172, Jul. 16, 2014; 61 pages.

Third Party Submission Under 37 CFR 1.290 in U.S. Appl. No. 13/559,340 from Eric Raciti, dated Jan. 9, 2015; 13 pages.

Final Office Action in U.S. Appl. No. 15/354,982, dated Oct. 9, 2018, 9 pages.

Final Office Action in U.S. Appl. No. 14/777,510, dated Jul. 30, 2018, 23 pages.

Petition for Inter Partes Review of U.S. Pat. No. 9,496,200, United States Patent and Trademark Office, Before the Patent and Trial Appeal Board, *Asetek Denmark A/S* v. *CoolIT Systems, Inc.*, IPR No. 2019-00705, filed Mar. 4, 2019, 73 pages.

Declaration of Donald E. Tilton, PH.D, (including his CV) from Petition for Inter Parties Review of U.S. Pat. No. 9,496,200 in *Asetek Denmark A/S/* v. *CoolIT Systems, Inc.* IPR No. 2019-00705, dated Mar. 1, 2019 76 pages.

Declaration of Steven B. Branton, from Petition for Inter Parties Review of U.S. Pat. No. 9,496,200, in *Asetek Denmark A/S/* v. *CoolIT Systems, Inc.* IPR No. 2019-00705, dated Feb. 26, 2019 7 pages.

Patent Owner's Preliminary Response of U.S. Pat. No. 9,496,200, United States Patent and Trademark Office, Before the Patent and Trial Appeal Board, *Asetek Denmark A/S* v. *CoolIT Systems, Inc.*, IPR No. 2019-00705, filed 13, 2019, 29 pages.

Petitioner's Reply to Patent Owner's Preliminary Response of U.S. Pat. No. 9,496,200, United States Patent and Trademark Office, Before the Patent and Trial Appeal Board, *Asetek Denmark A/S* v. *CoolIT Systems, Inc.*, IPR No. 2019-00705, filed on Jun. 28, 2019, 7 pages.

Patent Owner's Surreply in Support of Patent Owner's Preliminary Response of U.S. Pat. No. 9,496,200, United States Patent and Trademark Office, Before the Patent and Trial Appeal Board, *Asetek Denmark A/S* v. *CoolIT Systems, Inc.*, IPR No. 2019-00705, filed on Jul. 12, 2019, 6 pages.

Decision Instituting Inter Partes Review, IPR No. 2019-00705, entered Sep. 6, 2019, 22 pages.

Final Written Decision, IPR2019-00705, Paper 43 (P.T.A.B. Aug. 21, 2020) (dismissing Petition and determining no challenged claims in U.S. Pat. No. 9,496,200 unpatentable).

\* cited by examiner

MODULAR HEAT-TRANSFER SYSTEMS

RELATED APPLICATIONS

This application is a continuation of, and claims the benefit of and priority to, U.S. patent application Ser. No. 13/559,340, filed Jul. 26, 2012, now U.S. Pat. No. 9,496,200, which enjoys benefit of and priority to U.S. Patent Application No. 61/522,247, filed on Aug. 11, 2011, U.S. Patent Application No. 61/512,379, filed on Jul. 27, 2011, U.S. patent application Ser. No. 13/401,618, filed on Feb. 21, 2012, U.S. Patent Application No. 61/622,982, filed Apr. 11, 2012, U.S. Patent Application No. 61/622,947, filed Apr. 11, 2012, U.S. patent application Ser. No. 12/189,476, filed Aug. 11, 2008, and U.S. Patent Application No. 60/954,987, filed Aug. 9, 2007, each of which patent applications is hereby incorporated by reference in its respective entirety, for all purposes.

BACKGROUND

The innovations and related subject matter disclosed herein (collectively referred to as the "disclosure") concern systems configured to transfer heat from one fluid to another fluid, and more particularly, but not exclusively, to systems having a modular configuration. Some systems are described in relation to cooling electronic components by way of example, though the disclosed innovations may be used in a variety of other heat-transfer applications.

With the recent explosive growth of cloud-based services, the number of networked computers and computing environments, including servers, as substantially grown over the past several years. As used herein, the term "server" generally refers to a computing device connected to a computing network and running software configured to receive requests (e.g., a request to access or to store a file, a request to provide computing resources, a request to connect to another client) from client computers also connected to the computing network.

The term "data center" (also sometimes referred to in the art as a "server farm") loosely refers to a physical location housing one or more servers. In some instances, a data center can simply comprise an unobtrusive corner in a small office. In other instances, a data center can comprise several large, warehouse-sized buildings enclosing tens of thousands of square feet and housing thousands of servers.

Regardless of their size, data centers and the servers they house consume vast amounts of electrical power. Although operating servers account for a major portion of the power consumed by a given data center, cooling the servers using conventional approaches accounts for another significant portion of the consumed power.

Typical commercially-available servers have been designed to be cooled at least partially by air within the data center. Such servers usually comprise one or more printed circuit boards having a plurality of operable, heat dissipating devices (e.g., memory, chipsets, microprocessors, hard drives, etc.) mounted thereto. The printed circuit boards are commonly housed in an enclosure having vents configured to direct external air from the data center into, through and out of the enclosure. The air absorbs heat dissipated by the operable components. After exhausting from the enclosure, the heated air mixes with air in the data center and an air conditioner cools the heated data center air, consuming large amounts of energy in the process.

In general, higher performance server components dissipate correspondingly more power. However, the amount of heat that conventional cooling systems can suitably remove from the various operable devices corresponds, in part, to the extent of air conditioning available from the data center or other facility, as well as the level of power dissipated by adjacent components and servers. For example, the temperature of an air stream entering a server in such a data center can be influenced by the level of power dissipated by, and proximity of, adjacent servers, as well as the temperature of the air entering the data center (or, conversely, the rate at which heat is extracted from the air within the data center).

In general, a lower air temperature in a data center allows each server component cooled by an air flow to dissipate a higher power, and thus allows each server to operate at a correspondingly higher level of performance. Consequently, data centers have traditionally used sophisticated air conditioning systems (e.g., chillers, vapor-cycle refrigeration) to cool the air (e.g., to about 65° F.) within the data center to achieve a desired degree of cooling (e.g., corresponding to a desired performance level). Some data centers provide chilled water systems for removing heat from the air within a data center. However, rejecting heat absorbed by air in a data center using sophisticated air conditioning systems, including conventional chilled water systems, consumes high levels of power, and is costly.

In general, heat dissipating components spaced from each other (e.g., a lower heat density) can be more easily cooled than the same components placed in close relation to each other (e.g., a higher heat density). Consequently, data centers have also compensated for increased power dissipation (corresponding to increased server performance) by increasing spacing between adjacent servers. Nonetheless, relatively larger spacing between adjacent servers reduces the number of servers in (and thus the computational capacity of) the data center compared to relatively smaller spaces between adjacent servers.

Therefore, there exists a need for an effective and low-cost cooling alternative for cooling electronic components, such as, for example, rack mounted servers within data centers. There also remains a need for low-profile heat exchange assemblies (e.g., integrated heat sink and pump assemblies) configured to fit within commercially available servers having a vertical component height of less than 1.75 inches, or less. There also remains a need for heat-transfer systems for cooling varying numbers of servers within a given array of servers. In particular, there remains a need for reliable cooling systems configured to cool a variety of densities of server components within a rack, with a rack having from one to 42 servers being but one example of a desirable range of server densities to be cooled. There also remains a need for heat transfer systems configured to cool servers within a data center without employing costly air conditioning systems or chilled water systems.

SUMMARY

Innovations disclosed herein overcome many problems in the prior art and address the aforementioned, as well as other, needs, and pertain generally to modular heat-transfer systems and more particularly, but not exclusively, to modular components capable of being assembled into such systems. For example, some disclosed innovations pertain to cooling systems configured to cool one or more arrays of independently operable servers. Other innovations relate to configurations of individual modules capable of being combined with other modules into a modular heat-transfer system. Still other innovations relate to arrangements of interconnections between or among such modules. For example, this disclosure describes innovative arrays of heat-transfer modules configured to be combined with a manifold module and/or an environmental coupler (e.g., a liquid-liquid heat exchange module) to facilitate heat transfer between an environment and one or more operable elements (e.g., server components). Some disclosed configurations of such modules are capable of adequately cooling a plurality of rack-mounted servers in a data center without requiring the data center to provide chilled water at a temperature below an ambient temperature, eliminating the need for costly and power consuming chillers. And, other innovations relate to module and system configurations that eliminate one or more components from conventional systems while retaining one or more of each eliminated component's respective functions.

According to a first aspect, innovative modular heat-transfer systems are disclosed. Some embodiments of such modular systems include an array having at least one heat-transfer element defining an inlet and an outlet and being configured to transfer heat to a working fluid from an operable element corresponding to the at least one heat-transfer element, or to transfer heat from a working fluid to an operable element corresponding to the at least one heat-transfer element. A manifold module can have a distribution manifold and a collection manifold. A decoupleable inlet coupler can correspond to each respective inlet of each respective heat-transfer element in the array. Each respective inlet coupler can be configured to fluidicly couple the distribution manifold to the inlet of the respective heat-transfer element. A decoupleable outlet coupler can correspond to each respective outlet of each respective heat-transfer element in the array. Each respective outlet coupler can be configured to fluidicly couple the outlet of the respective heat-transfer element to the collection manifold. An environmental coupler can be configured to receive the working fluid from the collection manifold, to transfer heat to an environmental fluid from the working fluid or to transfer heat from an environmental fluid to the working fluid, and to discharge the working fluid to the distribution manifold.

The at least one heat-transfer element in the array can include a plurality of heat-transfer elements. At least one of the heat-transfer elements in the array can include a respective plurality of component heat-exchange modules. The respective plurality of component heat-exchange modules can be fluidically coupled with each other in series. Each of the component heat-exchange modules can include a respective pump configured to urge the working fluid through the respective at least one heat-transfer element.

At least one of the at least one heat-transfer element can include a pump configured to urge the working fluid through the respective heat-transfer element. The inlet of the respective heat-transfer element can be so fluidicly coupleable to the distribution manifold, the outlet of the respective heat-transfer element can be so fluidicly coupleable to the collection manifold, and the environmental coupler can be so fluidicly coupleable to the distribution manifold and to the collection manifold as to be capable of defining a closed-loop fluid circuit. The pump can be so configured as to be capable of urging the working fluid through the closed-loop fluid circuit.

The environmental coupler can include a liquid-liquid heat exchanger configured to transfer heat to or from a liquid-phase of the environmental fluid.

The decoupleable fluid coupler of the inlet conduit can be so configured as not to be matingly engageable with any of the collection fluid couplers of the manifold module. The decoupleable fluid coupler of the outlet conduit can be so configured as not to be matingly engageable with any of the distribution fluid couplers defined by the manifold module.

The at least one heat-transfer element can include a corresponding pair of component heat-exchange modules. Each in the pair of component heat-exchange modules can be configured to transfer heat dissipated by a respective electrical, opto-electrical or optical device to the working fluid. In some embodiments of innovative modular heat-transfer systems, a working fluid reservoir can be fluidicly coupled to the manifold module.

Some innovative modular heat-transfer systems also include a rack configured to receive at least one independently operable server. Each in the at least one independently operable server can include an operable element. The rack can be configured to mountably receive the manifold module. One heat-transfer element can correspond to each at least one independently operable server and can be configured to transfer heat dissipated by the respective independently operable server to the working fluid. The environmental coupler can be configured to reject at least a portion of the heat dissipated by the respective independently operable server heat to the environmental fluid from the working fluid.

Some innovative modular heat-transfer systems include a sensor configured to emit a signal corresponding to one or more of a relative humidity of an environment, an absolute humidity of an environment, a temperature of an environment, a wet-bulb temperature of an environment, a temperature of the working fluid in a portion of the manifold module, a temperature of the working fluid in a portion of the environmental coupler, a temperature of the environmental fluid in a portion of the environmental coupler, a volume of the working fluid in a portion of the environmental coupler, a temperature of the working fluid in a portion of one or more heat-transfer elements, a leak of the working fluid, a leak of the environmental fluid, or a combination thereof. Some innovative modular heat-transfer systems include one or more actuatable valves configured to limit a flow of the working fluid, the environmental fluid, or both, at least partially responsively to the signal emitted by the sensor.

A supply apparatus can be configured to supply to the environmental coupler the environmental fluid at a relatively lower temperature compared to a temperature of the working fluid within the environmental coupler. A heat exchanger can be configured reject, from the environmental fluid to an environment, heat absorbed by the environmental fluid from the working fluid within the environmental coupler. The supply apparatus can include an air-cooled environmental heat exchanger configured to reject heat from the environmental fluid to atmospheric air.

According to a second aspect, innovative coolant heat-exchange modules are disclosed. In some embodiments, a coolant heat-exchange module includes an inlet configured to receive a working fluid from a collection manifold, and an outlet configured to discharge the working fluid to a distribution manifold. A heat exchanger can be configured to reject to a relatively cooler environmental fluid, from the working fluid, heat absorbed by the working fluid from an array of operable elements.

In some embodiments, the coolant heat-exchange module can be mountably coupleable to an equipment enclosure housing the array of operable elements. The heat exchanger can be so configured as to provide a sufficient rate of heat transfer from the working fluid to cool the working fluid to a suitable temperature when the working fluid is conveyed by one or more pumps positioned externally of the coolant heat exchange module.

The one or more pumps positioned externally of the coolant heat exchange module can include a pump fluidicly coupled between the collection manifold and the distribution manifold. For example, a plurality of pumps fluidicly can be coupled between the collection manifold and the distribution manifold.

In some instances, but not all, the coolant heat-exchange module further can include a pump. Such a pump can be fluidicly coupled between the inlet and the heat exchanger, such a pump can be fluidicly coupled between the heat exchanger and the outlet, or both.

In some instances, one or more actuatable valves are configured to control a flow rate of the environmental fluid, the working fluid, or both. A temperature sensor can be configured to measure a temperature of a surface of the coolant heat-exchange module, an ambient air temperature, or both. A humidity sensor can be configured to measure a humidity of ambient air in which the coolant heat-exchange module is installed.

Some coolant heat-exchange modules also include a calculator configured to determine a dew point temperature at least partially based on the humidity of ambient air measured by the humidity sensor. A controller can be configured to actuate at least one of the one or more actuatable valves at least partially responsively to the dew point temperature determined by the calculator.

Some coolant heat-exchange modules include one or more sensors, each sensor being configured to emit a signal corresponding to one or more of a relative humidity of an environmental fluid, an absolute humidity of an environmental fluid, a temperature of an environmental fluid, a temperature of a liquid in the manifold module, a temperature of a liquid in the first fluid conduit of the heat exchanger, a temperature of a liquid in the second fluid conduit of the heat exchanger, a volume of coolant in the coolant reservoir, a temperature of a liquid in one or more of the plurality of equipment heat exchangers, a temperature of a surface of one or more of the plurality of equipment heat exchangers, a temperature of the facility coolant entering the second fluid conduit, a temperature of the facility coolant flowing from the second fluid conduit, a leak of equipment coolant, a leak of facility coolant, or a combination thereof. The controller can also be configured to actuate the one or more actuatable valves to control a flow rate of the environmental fluid, the working fluid, or both, at least partially responsively to a signal received from one of the one or more sensors.

Some coolant heat-exchange modules include a transmitter configured to transmit a signal containing information corresponding to the signal received from the one or more sensors. The controller and the calculator can together be configured to prevent condensation from forming on the coolant heat exchange module or any feature thereof.

According to a third innovative aspect, heat-exchange elements are disclosed. A heat-exchange element can include a first heat sink having a first plurality of juxtaposed fins defining a corresponding first plurality of microchannels between adjacent fins. Each of the fins can define a respective distal edge. A first manifold body can overlie at least a portion of each of the distal edges of the first heat sink and define an opening configured to deliver a flow of fluid to the microchannels of the first heat sink in a direction transverse to the microchannels of the first heat sink.

A second heat sink can have a second plurality of juxtaposed fins defining a corresponding second plurality of microchannels between adjacent fins. Each of the fins can define a respective distal edge. A second manifold body can overlie at least a portion of each of the distal edges of the second heat sink and define an opening configured to deliver a flow of fluid to the microchannels of the second heat sink in a direction transverse to the microchannels of the second heat sink.

The second manifold body and the second heat sink can be fluidicly coupled with the first heat sink in series.

Other innovative aspects of this disclosure will become readily apparent to those having ordinary skill in the art from a careful review of the following detailed description (and accompanying drawings), wherein various embodiments of disclosed innovations are shown and described by way of illustration. As will be realized, other and different embodiments of modules and systems incorporating the disclosed innovations are possible and several disclosed details are capable of being modified in various respects, all without departing from the spirit and scope of the principles disclosed herein. For example, the detailed description set forth below in connection with the appended drawings is intended to describe various embodiments of the disclosed innovations and is not intended to represent the only embodiments contemplated by the inventor. Instead, the detailed description includes specific details for the purpose of providing a comprehensive understanding of the principles disclosed herein. Accordingly the drawings and detailed description are to be regarded as illustrative in nature and not as restrictive.

BRIEF DESCRIPTION OF THE DRAWINGS

Unless specified otherwise, the accompanying drawings illustrate aspects of the innovative subject matter described herein. Referring to the drawings, wherein like reference numerals indicate similar parts throughout the several views, several examples of systems incorporating aspects of the presently disclosed principles are illustrated by way of example, and not by way of limitation, wherein.

DETAILED DESCRIPTION

The following describes various innovative principles related to module heat-transfer systems by way of reference to specific examples of modular heat-transfer systems, and more particularly but not exclusively, to modular heat-transfer systems configured to cool an array of servers (e.g., in a data center). Nonetheless, one or more of the disclosed principles can be incorporated in various system configurations to achieve any of a variety of corresponding system characteristics. Systems described in relation to particular configurations, applications, or uses, are merely examples of systems incorporating one or more of the innovative principles disclosed herein and are used to illustrate one or more innovative aspects of the disclosed principles.

Thus, heat-transfer systems having attributes that are different from those specific examples discussed herein can embody one or more of the innovative principles, and can be used in applications not described herein in detail, for example, to transfer heat to or from laser components, light-emitting diodes, chemical reactants undergoing a chemical reaction, photovoltaic cells, solar collectors, power electronic components, electronic components other than microprocessors, photonic integrated circuits, and other electronic modules, as well as a variety of other industrial, military and consumer devices now known or hereafter developed. Accordingly, such alternative embodiments also fall within the scope of this disclosure.

Overview

Following is a description of modular heat-transfer systems configured to transport heat between an array of heat-transfer elements and an environmental heat-transfer coupler. Some disclosed modular heat-transfer systems are configured to cool an array of n independently operable servers (or components thereof). Other disclosed modular heat-transfer systems are configured, for example, to heat a solution of chemical reactants undergoing an endothermic chemical reaction.

Server Cooling Systems

Figure 1:
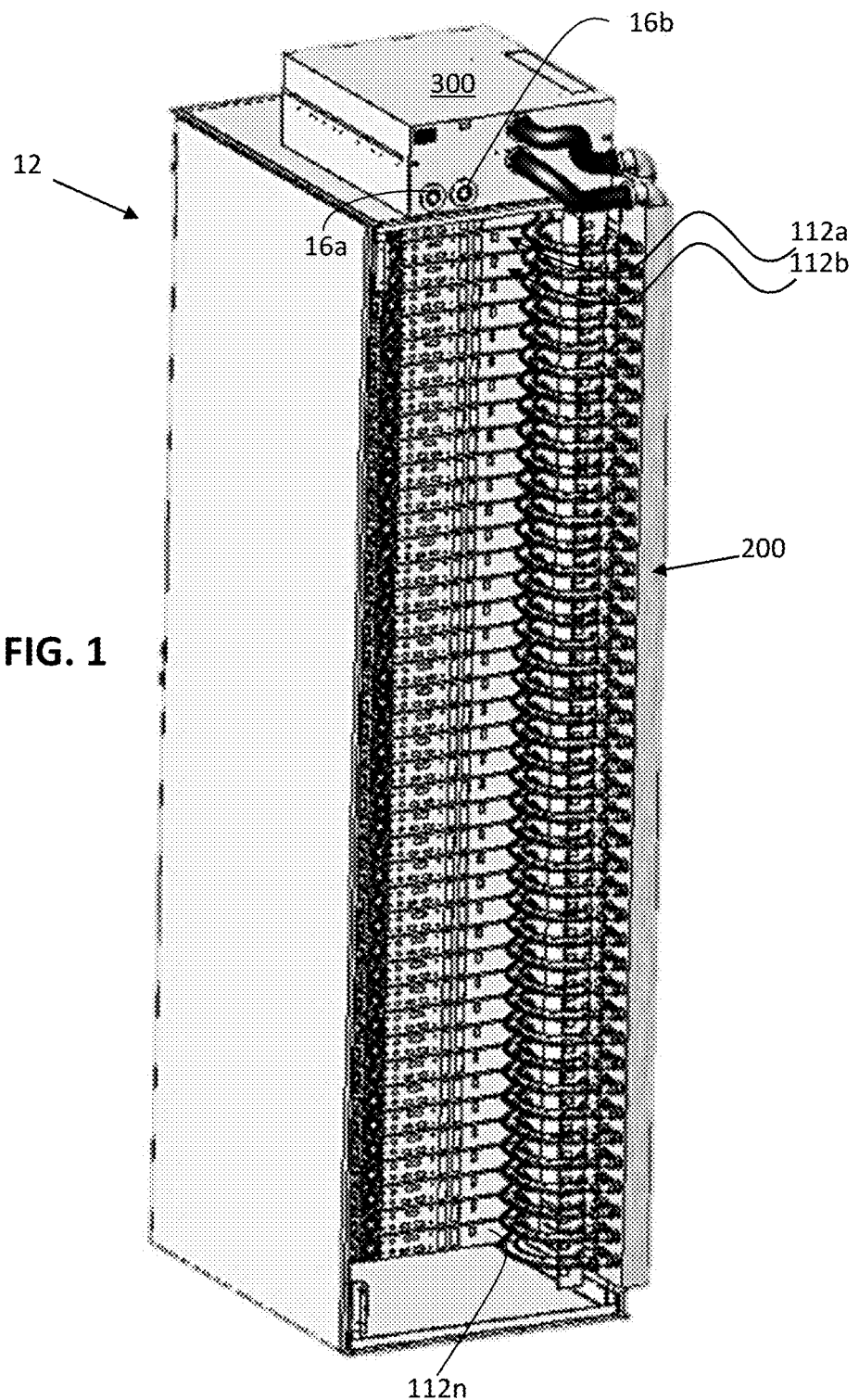
FIG. 1 shows an isometric view of one embodiment of a modular heat-transfer system configured to cool a plurality of independently operable, rack-mounted servers.

As but one example of disclosed heat-transfer systems, FIG. 1 shows a cooling system configured to cool an array of independently operable servers 112a, 112b . . . 112n mounted in a rack, or chassis. For example, each in an array of heat-transfer elements 110a, 110b . . . 110n can be thermally coupled to a respective component that dissipates heat during operation of the servers 112a, 112b . . . 112n.

A manifold module 200 can be configured to distribute a relatively cooler coolant among the plurality of heat-transfer elements 110a, 110b . . . 110n, allowing the coolant to absorb heat from the servers and to cool the respective components within the servers. The manifold 200 can collect the working fluid from the array of heat-transfer elements and convey the working fluid to an environmental coupler 15 (e.g., a liquid-liquid heat exchanger).

Figure 2:
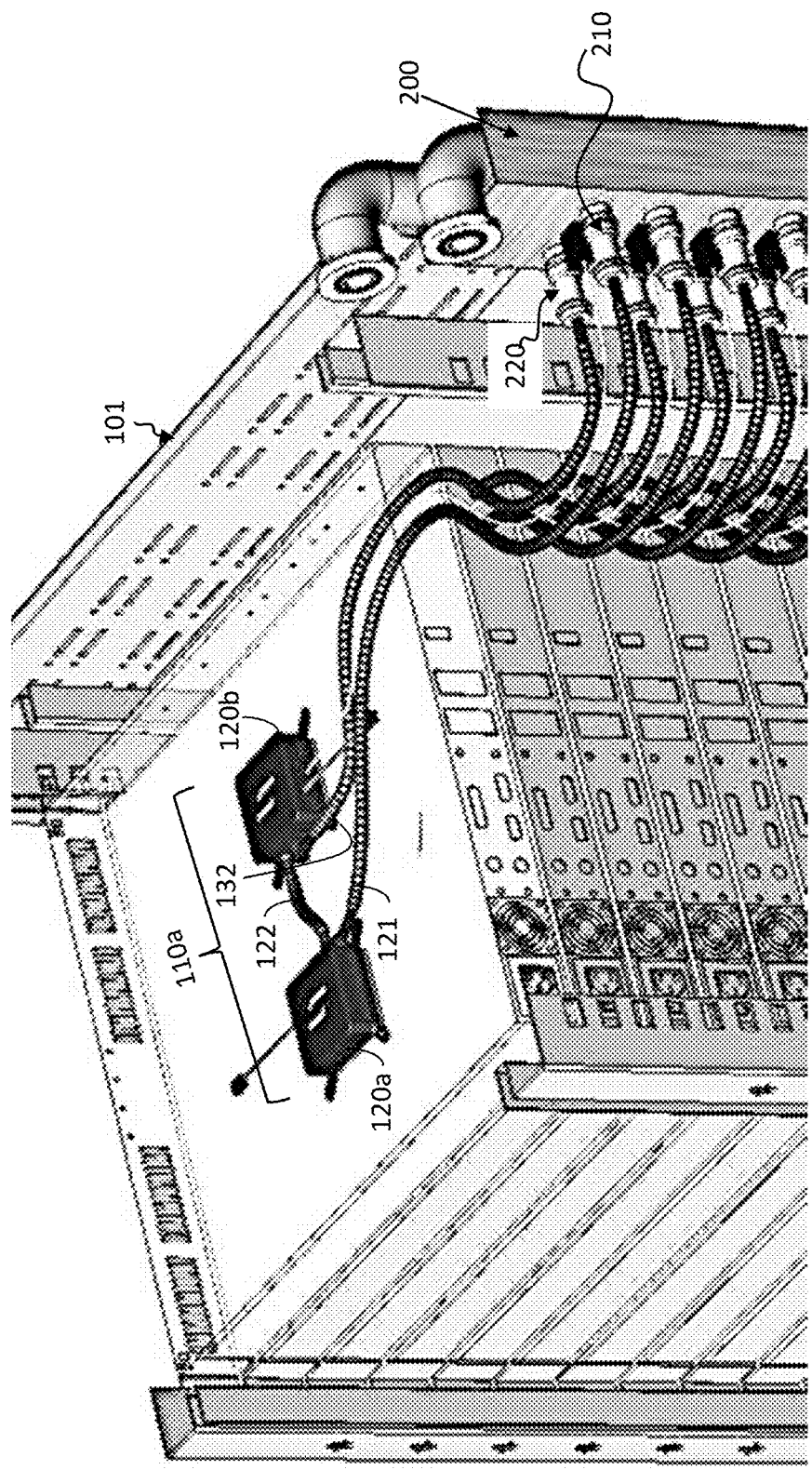
FIG. 2 shows an isometric view of a portion of the modular heat-transfer system shown in FIG. 1, together with features of a heat-transfer element.

FIG. 2 shows a representative heat-transfer element 110a within a representative one of the servers (e.g., server 112a). The representative heat-transfer element 110a can have a modular configuration (e.g., including a pair of component heat-transfer modules 120a, 130a configured to cool a corresponding pair of microprocessors or other server components (not shown)). An inlet to the heat-transfer element 110a can be fluidicly coupled to a distribution manifold 210 and an outlet of the heat-transfer element 110a can be fluidicly coupled to a collection manifold 220.

The environmental coupler 15 can be configured to facilitate the rejection of heat from the coolant to an environmental working fluid (e.g., facility water) to cool the coolant. For example, the environmental coupler 15 can be cooled by passing a relatively cooler environmental working fluid from the environment 16 through the coupler 15. As the relatively warm coolant (or, more generally, working fluid) passes through the environmental coupler 15, it rejects at least some of the heat absorbed in the heat-transfer elements to the environment 16 (e.g., the environmental working fluid), cooling the working fluid. Afterward, the relatively cooler coolant can be re-distributed among the heat-transfer elements by the manifold module, providing substantially continuous cooling to the array of servers.

As but one example, discussed more fully below and shown in FIG. 1, an equipment heat-transfer module 100 can include a chassis 101, or rack, configured to receive a plurality of independently operable servers. The manifold module 200 can be positioned adjacent the chassis 101, and the chassis can support the environmental coupler.

Other Modular Heat-Transfer Systems

Figure 3:
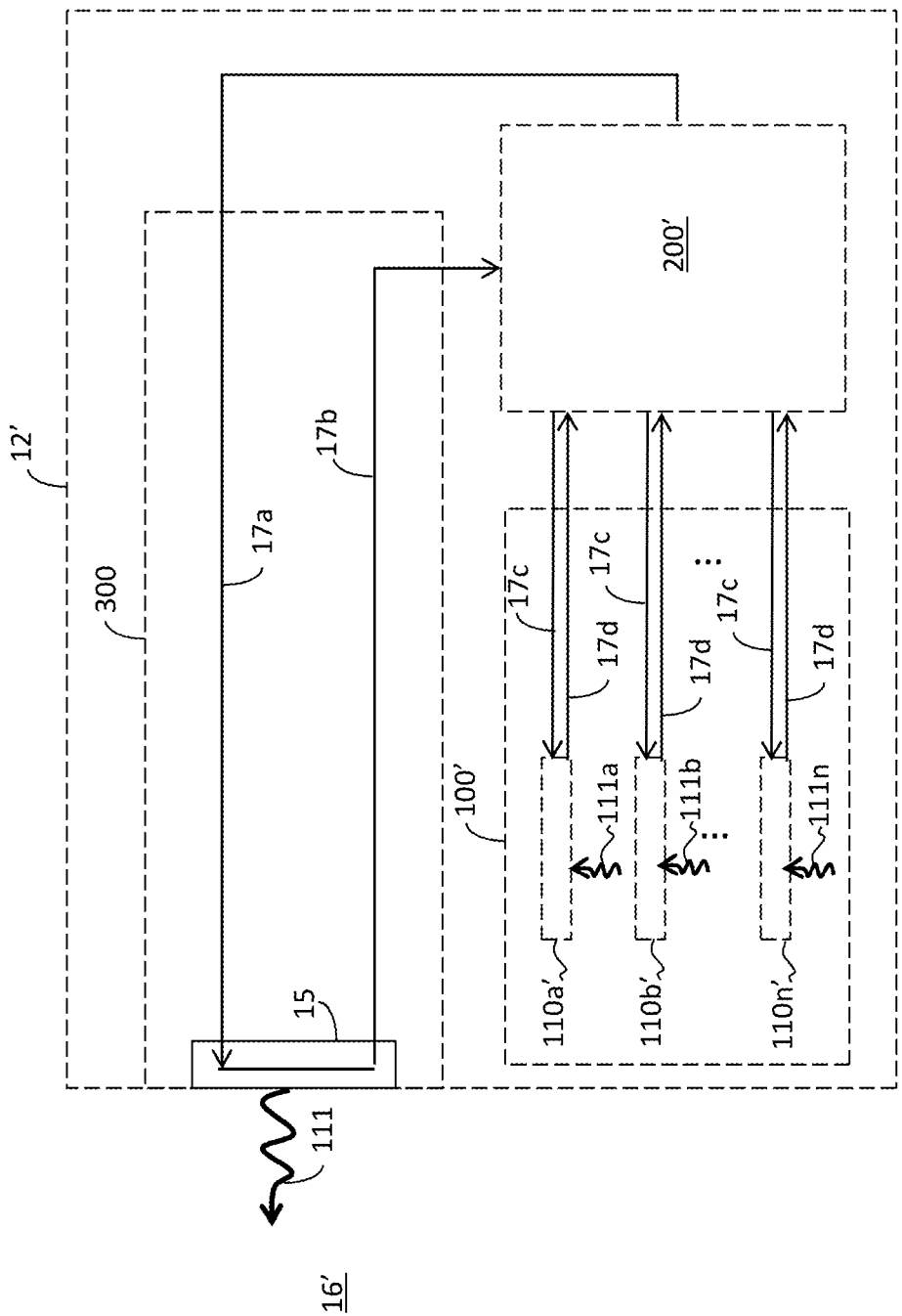
FIG. 3 shows a schematic illustration of a modular heat-transfer system.
Figure 4:
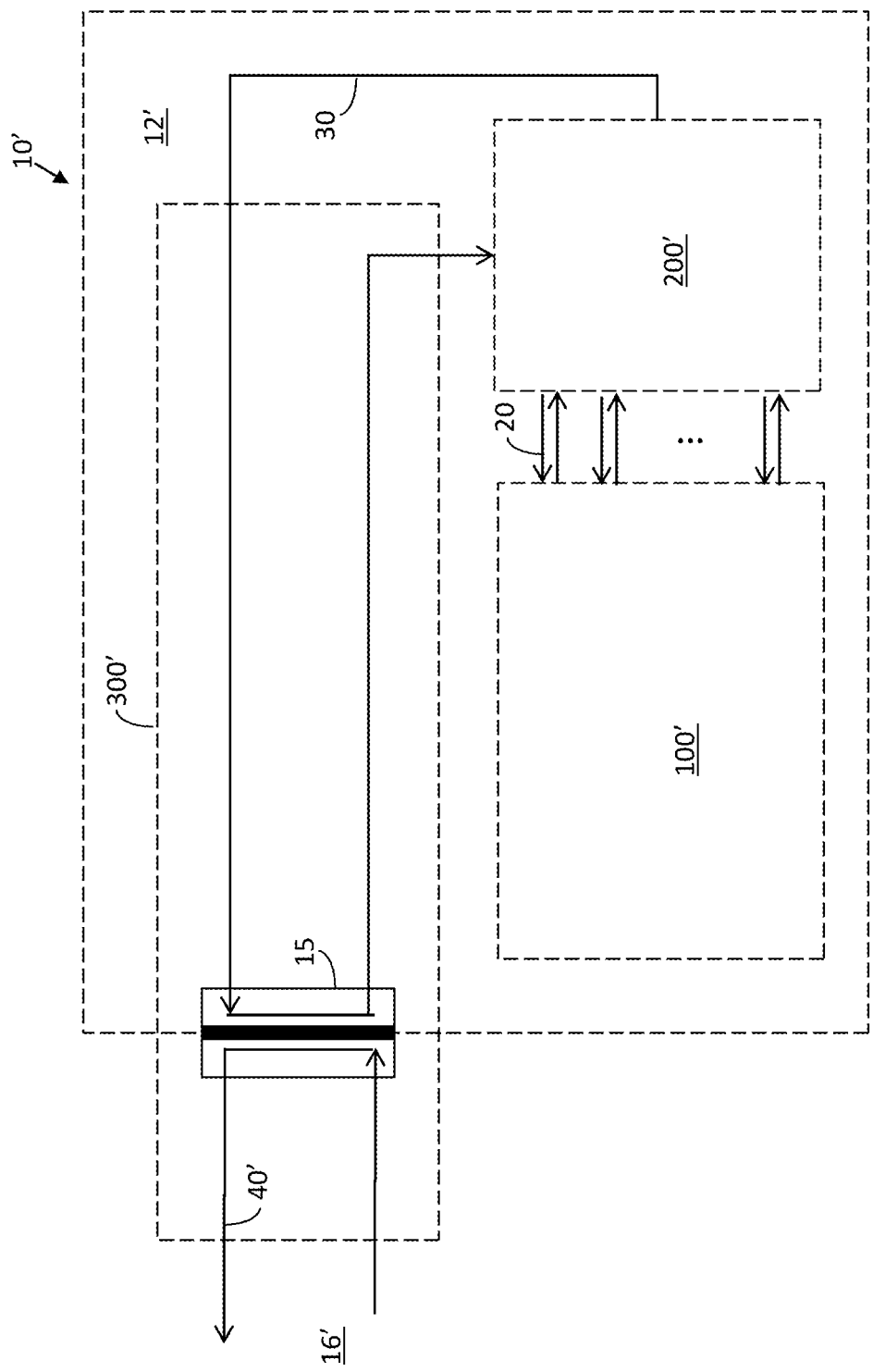
FIG. 4 shows a schematic illustration of a portion of the modular heat-transfer system shown in FIG. 3.

Other modular heat-transfer system configurations are also described herein. As indicated in FIGS. 3 and 4, a modular heat transfer system 10' can be generalized from the system shown in FIGS. 1 and 2.

For example, such a system 10' can have a manifold 200' configured to distribute a working fluid among an array 100' of n heat-transfer elements 110a', 110b' . . . 110n', each being thermally coupled to a respective operable element (not shown) within a corresponding array of n operable elements. As with the modular heat-transfer system 10 shown in FIG. 1, the modular heat-transfer system 10' shown in FIG. 3 can have an equipment heat-transfer module 12' configured to exchange heat between an array 100' of one or more heat-transfer elements 110a', 110b', . . . 110n' and a coolant heat-exchange module 300' having an environmental coupler 15' (e.g., a liquid-liquid heat exchanger) by circulating a working fluid through a fluid circuit 17a, 17b, 17c, 17d. The coupler 15' can be configured to transfer heat 111 (e.g., 111a, 111b . . . 111n in FIG. 3) between the equipment heat-transfer module 12' and an environmental working fluid 40' (e.g., a facility's water supply) in an environment 16'. In a general sense, the modular heat-transfer system 10' can be configured to reject heat to the environment 16' (as in server-cooling applications) or to absorb heat from the environment (as in applications pertaining to endothermic reactions).

Apart from systems configured to cool a plurality of servers that dissipate heat during operation, some disclosed heat transfer systems can be configured to heat a plurality of devices. As but one example, a chemical processor can be configured to house a plurality of endothermic chemical reactions. An array of heat-transfer elements can be configured to transfer heat to the chemical processor from an environment 16'. For example, the environmental coupler 15' can be maintained at a relatively warmer temperature, and heat can be transferred from the coupler to an array 100' of relatively cooler heat-transfer elements. In such an instance, the working fluid within the equipment heat-transfer module 12' can circulate as described above, carrying heat from the relatively higher temperature coupler 15', through a manifold module 200, and rejecting heat to one or more relatively cooler operable elements (e.g., reactor vessels) corresponding to a respective one or more heat-transfer elements 110a', 110b' . . . 110n' in the array 100'.

The array of n operable elements (e.g., reactor vessels) can be coupled to a chassis, an enclosure or other housing, and the chassis, enclosure or other housing can form a portion of the heat-transfer module 12'.

Heat-transfer systems configured as shown in FIGS. 1 and 3 can provide scalable rates of heat transfer for arrays having varying numbers of independently operable elements at relatively low overall cost, among many advantages, compared to conventional heat-transfer systems.

Working Fluids

As used herein, "working fluid" means a fluid used for or capable of absorbing heat from a region having a relatively higher temperature, carrying the absorbed heat (as by advection) from the region having a relatively higher temperature to a region having a relatively lower temperature, and rejecting at least a portion of the absorbed heat to the region having a relatively lower temperature.

In some embodiments (e.g., endothermic chemical reactions), the environmental working fluid has a relatively higher temperature than an operable component (e.g., a reaction chamber) corresponding to a given heat-transfer element in the array 100' (FIG. 4). In other embodiments (e.g., exothermic chemical reactions, servers, lasers), the environmental working fluid has a relatively lower temperature than an operable component (e.g., a reaction chamber, an integrated circuit, a light source).

As used herein, "coolant" refers to a working fluid capable of being used in or actually being used in a heat-transfer system configured to maintain a region of a device at or below a selected threshold temperature by absorbing heat from the region. Although many formulations of working fluids are possible, common formulations include distilled water, ethylene glycol, propylene glycol, and mixtures thereof.

Equipment Module

Many varieties of apparatus can be configured to receive a plurality of operable elements. For example, an equipment enclosure, commonly referred to as an "equipment rack" or a "rack", can be configured to receive a plurality of independently operable equipment elements (e.g., servers), as shown in FIG. 1.

Although a cooling system for a rack-mounted server is described in some detail as an example of a modular heat-transfer system incorporating disclosed principles, other embodiments of heat-transfer systems are contemplated. For example, scientific instruments, telecommunications devices (e.g., routers and switches), audio equipment (e.g., amplifiers, pre-amplifier conditioning units, and audio receivers), video equipment (e.g., players), laser equipment, lighting equipment (e.g., incandescent lighting and light-emitting diodes), chemical processing equipment, biological processing equipment and other equipment, are contemplated embodiments of operable elements to which modular heat-transfer systems can be applied. Such operable elements can be received by an equipment enclosure, and such an equipment enclosure can be included in an equipment module 12.

Some commercially available equipment racks are configured to receive operable elements having a frontal area measuring about 19-inches wide and an integer-multiple of about 1.75 inches in height. An operable element's height is sometimes measured in Rack Units (commonly referred to as "U" or, less commonly, "RU"). Thus, an operable element measuring about 1.75 inches in height measures 1U in height, and is sometimes referred to as a "1U" element. Similarly, a 2U element measures about 3.5 inches in height, and a 4U element measures about 7 inches in height.

To facilitate installation in commonly available racks, most operable elements 112a, 112b . . . 112n have a front-panel height measuring about 1/32-inches (0.31 inches) less than the corresponding multiple of rack units. For example, a 1U element typically measures about 1.719 inches tall, rather than 1.75 inches tall, and a 2U typically measures about 3.469 inches tall instead of 3.5 inches tall. A gap above and/or below an installed piece of equipment facilitates installation and removal without mechanically interfering with adjacent equipment.

Other standardized equipment racks are also commercially available. In the telecommunications industry, for example, equipment racks commonly are configured to receive operable elements having a frontal area measuring about 23 inches wide and about 1 inch in height.

Although standardized equipment enclosures are described in some detail herein, other embodiments of equipment modules are contemplated. For example, an equipment module need not be distinct from an operable element or configured to receive an operable element to take advantage of the scalable nature of disclosed heat-transfer systems. For example, an enclosure of a mainframe- or a super-computer can include a coolant heat exchanger, manifold module and an array of heat-transfer elements as disclosed herein. In other embodiments, an equipment module can be configured as a room or a closet within a structure, or a volume within an airframe selected to house a plurality of operable elements.

Heat-Transfer Elements

As noted above, an array of one or more heat-transfer elements 110a, 110b . . . 110n can be configured to transfer heat to or from a working fluid passing through the respective heat-transfer elements. As shown, for example, in FIGS. 2 and 7, each heat-transfer element 110a, 110b . . . 110n can include one or more heat exchange modules (120a, 120b) configured to absorb heat from, or to reject heat to, an operable element or a component thereof.

As used herein, the terms "heat sink" and "heat exchanger" are interchangeable and mean a device configured to transfer energy to or from a fluid, as through convection (i.e., a combination of conduction and advection) or phase change of a working fluid. A heat exchange module can be a heat exchanger, or can include a heat exchanger in combination with one or more other components. For example, as described more fully below, a heat exchange module can include a duct or a housing in combination with a heat exchanger. As well, a heat exchange module can include a heat exchanger in combination with an integrated housing and a pump, together with any associated seals, gaskets and/or couplers.

Several examples of suitable heat exchange modules are described, for example, in U.S. Patent Application No. 60/954,987, filed on Aug. 9, 2007, U.S. patent application Ser. No. 12/189,476, filed on Aug. 11, 2008, U.S. Patent Application No. 61/512,379, filed on Jul. 27, 2011, U.S. patent application Ser. No. 13/401,618, filed on Feb. 21, 2012, and U.S. Patent Application No. 61/622,982, filed on Apr. 11, 2012, which patent applications are hereby incorporated by reference in their entirety, for all purposes.

Figure 6:
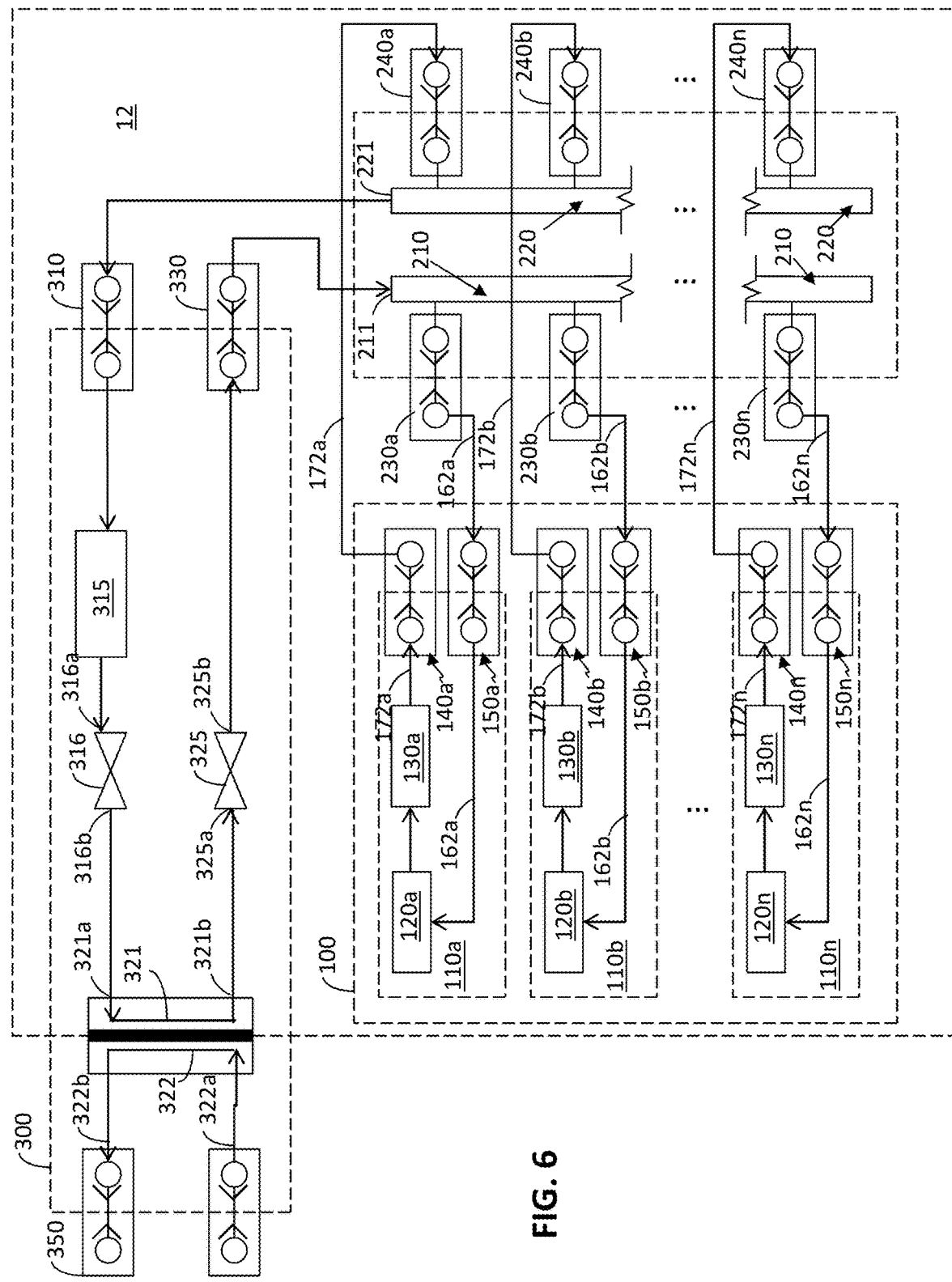
FIG. 6 shows a schematic illustration of the modular heat-transfer system in FIG. 5 with features of the heat-transfer elements and the environmental coupler shown.

As noted, some heat-transfer elements 110a, 110b . . . 110n include a plurality of heat exchange modules 120a, 130a, 120b, 130b . . . 120n, 130n (FIG. 6). Each in the plurality of heat exchange modules can correspond to, for example, a respective heat-dissipating device, or a group of respective heat dissipating devices, within a given operable element (e.g., server).

Figure 6B:
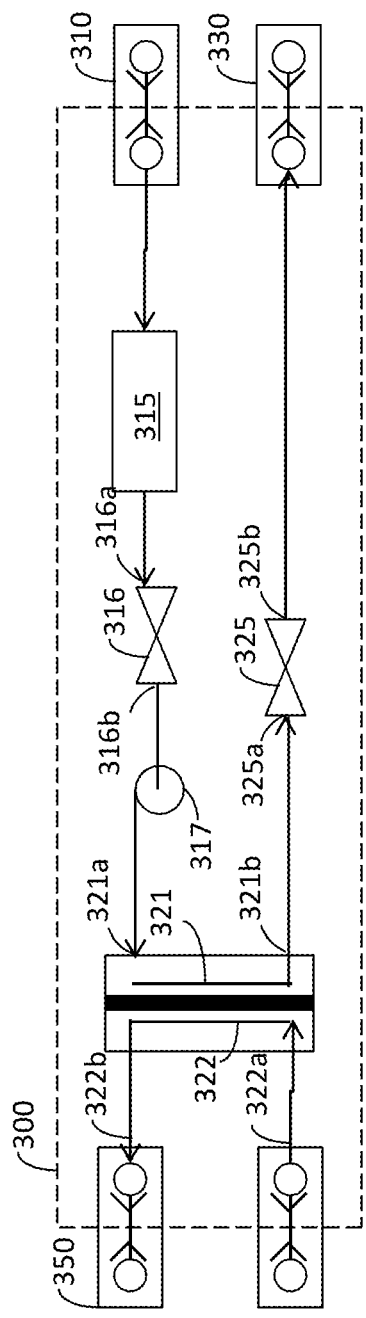
FIG. 6B shows a schematic illustration of an alternative configuration of a coolant heat exchanger.
Figure 6A:
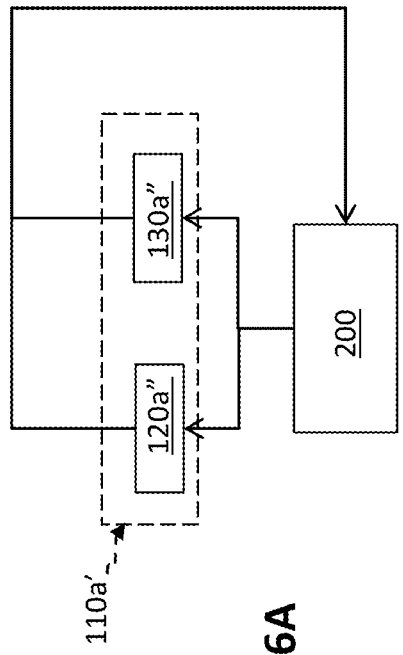
FIG. 6A shows a schematic illustration of an alternative configuration of a heat-transfer element.
Figure 7:
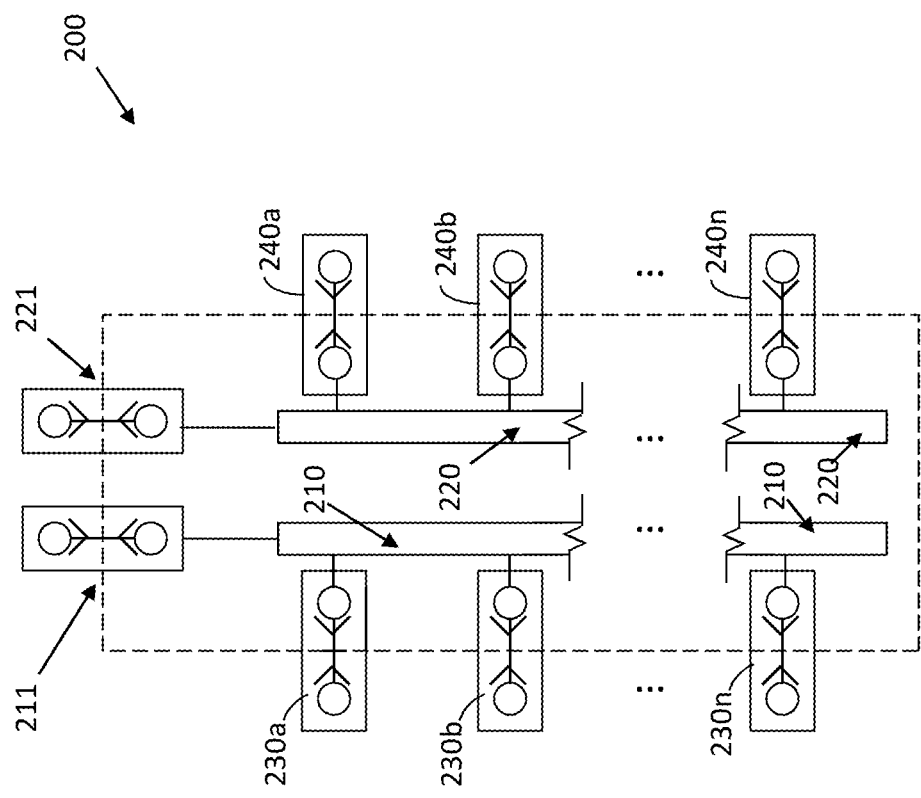
FIG. 7 shows a schematic illustration of a manifold module of the type shown in FIGS. 1 and 3.

Plural heat exchange modules, e.g., modules 120a, 130a, can be fluidically coupled to each other in series (e.g., such that a volume of working fluid passes from one heat exchange module 120a to another heat exchange module 130a before returning to a collection manifold 210 (or other system component), as shown for example in FIGS. 2 and 7). Alternatively, plural heat exchange modules, e.g., modules 120a", 130a", can be fluidically coupled to each other in parallel within a given heat-transfer element 110a" (e.g., such that a first mass of working fluid passes through one heat exchanger 120a" and a second mass of working fluid passes through another heat exchanger 130a"), as shown in FIG. 6A.

In the context of a rack-mountable server having a plurality of heat-dissipating devices (e.g., microprocessors, chipsets, memory, graphics components, voltage regulators), a heat-transfer element 110a, 110b . . . 110n can include a single-phase or a two-phase heat exchange module for cooling the respective devices. As used herein, "phase" refers to a thermodynamic state of a substance, e.g., a liquid phase, a solid phase, a gas phase, or a saturated mixture of liquid and gas. As used herein, a "single-phase" heat exchange module refers to a heat exchange module in which the working fluid undergoes little or no net change of phase, remaining in substantially the same phase (e.g., a liquid) as the fluid passes through the heat exchange module. As used herein, a "two-phase" heat exchange module refers to a heat exchange module in which the working fluid undergoes a change of phase (e.g., evaporation of a liquid to a gas phase or condensation of a gas to a liquid phase) as the fluid passes through the heat exchange module.

For a given mass of working fluid, a "two-phase" heat exchange module can typically absorb or reject more heat for a given change in temperature, and in some instances provide more suitable cooling or heating relative to a given temperature threshold, than a "single-phase" heat exchange module because the latent heat of vaporization (or condensation) of most working fluids is substantially greater than the specific heat of the fluid (e.g., a single-phase fluid may change temperature in proportion to the amount of absorbed or rejected heat, whereas a fluid undergoing phase-transition typically stays within a relatively narrower range of temperature as it absorbs or rejects heat).

Since a temperature and/or a phase of a given mass of working fluid can change as it passes through a first heat exchange module, the capacity of the given mass of working fluid to exchange heat as it passes through a second heat exchange module fluidically coupled to the first heat exchanger in series may be somewhat diminished as compared to the case in which a comparable mass of working fluid enters the second heat exchange module without being heated by the first heat exchange module (e.g., assuming a temperature of the fluid and/or the downstream heat exchanger is limited by a fixed upper threshold temperature). Nonetheless, in many instances, including many equipment cooling embodiments (e.g., cooling rack-mountable servers shown in FIG. 1), such a temperature change does not appreciably diminish the cooling capacity of a downstream heat exchanger. For example, a flow rate of the working fluid can be increased to compensate for relatively higher rates of heat dissipation by an operable element, ensuring that a temperature of a working fluid within the respective heat-transfer element 110a, 110b . . . 110n remains below an upper threshold temperature before entering a downstream heat exchanger. Similarly, for relatively lower rates of heat dissipation, a flow rate of the working fluid can be decreased to a suitable level that maintains a given temperature below an upper threshold while simultaneously reducing the amount of power consumed to pump the fluid through the heat-transfer element (and/or through the system 10).

Component Heat-Exchange Modules

A variety of heat exchange module and pump embodiments are suitable to be incorporated into a heat-transfer element 110a, 110b . . . 110n of the type described above. For example, several representative embodiments of heat exchange modules and pump configurations are disclosed in U.S. Patent Application No. 60/954,987, filed on Aug. 9, 2007, U.S. patent application Ser. No. 12/189,476, filed on Aug. 11, 2008, U.S. Patent Application No. 61/512,379, filed on Jul. 27, 2011, U.S. patent application Ser. No. 13/401,618, filed on Feb. 21, 2012, and U.S. Patent Application No. 61/622,982, filed Apr. 11, 2012, which patent applications are hereby incorporated by reference in their entirety, for all purposes, and each of which is incorporated herein in its entirety by reference and owned by the Assignee of this application.

As but one example, the '379 Application discloses embodiments of a heat exchange module having an integrated pump fluidicly coupled to a heat exchanger in series and positioned upstream of the heat exchanger. As the '379 Application explains, a working fluid can enter an inlet to a heat exchange module and the pump can increase a pressure head in the working fluid, urging the working fluid through the corresponding heat exchanger. The '379 Application also discloses that, in some embodiments, after passing through the respective heat exchanger, the working fluid exhausts from the heat exchange module and passes through a remotely positioned heat exchanger (e.g., to reject heat absorbed passing through the respective heat exchanger).

Figure 11:
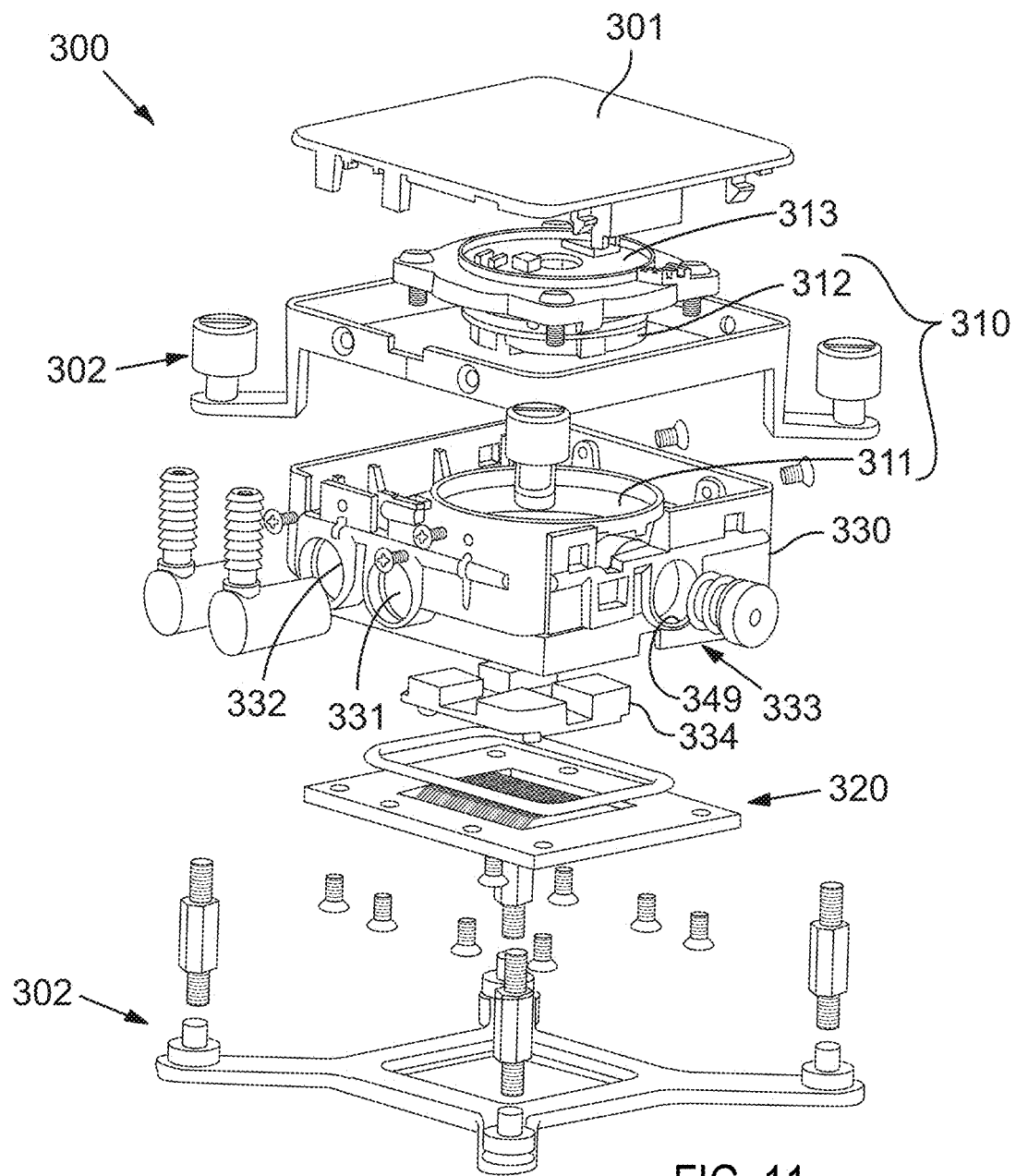
FIG. 11 illustrates an exploded view of one embodiment of an integrated pump and heat exchanger assembly.

Referring now to FIG. 11, a working example of an integrated subassembly is described. The illustrated subassembly 1300 comprises a pump 1310 and a heat exchanger 1320, as well as housing 1330 with integrated fluid conduits extending therebetween. The subassembly 1300 is but one example of an approach for integrating several elements of the fluid circuit (e.g., the pump and the first heat exchanger, including the inlet manifold, the fluid passages, the exhaust manifold) into a single element while retaining the several elements' respective functions. The housing 1330 is configured to convey a working fluid from an inlet port 1331 to a pump volute 1311, from the pump volute to an inlet 1321 to the heat exchanger 1320, and from an outlet 1322 of the heat exchanger to an outlet port 1332.

The pump impeller 1312 can be received in the pump volute 1311. The impeller can be driven in rotation by an electric motor 1313 in a conventional manner. A cap 1301 can overlie the motor 1313 and fasten to the housing 1330 to provide the subassembly 1300 with a finished appearance suitable for use with, for example, consumer electronics.

The side 1333 of the housing 1330 positioned opposite the pump volute 1311 can receive an insert 1334 and the heat exchanger 1320. A seal (e.g., an O-ring) 1323 can be positioned between the housing 1330 and the heat exchanger 1320 to reduce and/or eliminate leakage of the working fluid from the interface between the heat exchanger 1320 and the housing 1330.

The heat exchanger 1320 defines a lower-most face of the assembly 1300, as well as a surface configured to thermally couple to an integrated circuit (IC) package (not shown). A retention mechanism 1302 can mechanically couple the assembly to a substrate, such as a printed circuit board to which the IC package is assembled.

A plurality of heat exchange modules of the type disclosed in the '379 Application, as well as in other above referenced patent applications, can be fluidicly coupled to each other in series or in parallel, and used to exchange heat with one or more corresponding components. As but one example, FIGS. 2 and 6 illustrate two heat exchange modules, e.g., modules 120a, 130a, fluidicly coupled to each other in series. FIG. 6A, on the other hand, shows two heat exchange modules, e.g., modules 120a", 130a", fluidicly coupled to each other in parallel.

When two heat exchange modules 120a, 130a are coupled to each other in series, the working fluid can pass from one heat exchange module 120a into the other heat exchange module 130a (e.g., before flowing through a remotely positioned heat exchanger). For example, an inlet 121 to a first heat exchange module 120a having a pump and a heat exchanger can be fluidicly coupled to a distribution manifold 210. An outlet 122 from the first heat exchange module 120a can be fluidicly coupled to an inlet 131 to a second heat exchange module 130a having a pump and a heat exchanger. An outlet 122 from the second heat exchange module 130a can be fluidicly coupled to a collection manifold 220.

In such a series configuration, a working fluid exhausts from the distribution manifold 210 and enters the inlet 121 to the first (e.g., the upstream) heat exchange module 120a. The working fluid then enters into the corresponding pump volute defined by the integrated housing, allowing the pump impeller to increase a pressure head in the working fluid. The fluid subsequently passes from the heat exchanger, and exhausts from the outlet 122 of the first heat exchange module 120a.

With the first and the second heat exchange modules 120a, 130a fluidicly coupled to each other in series, the fluid then enters the inlet 131 to the second (e.g., downstream) heat exchange module 130a. In the second heat exchange module 130a, the working fluid follows a similar path as through the first heat exchange module 120a, e.g., flows through a pump and downstream heat exchanger before exhausting from the outlet 132 of the second heat exchange module 130a, and flows into the collection manifold 220.

Fluidicly coupling heat exchange modules to each other in series, as described above, can provide a measure of redundancy to the fluid distribution system. For example, coupling a plurality of heat exchange modules, e.g., modules 120a, 130a, each having a corresponding pump and a corresponding heat exchanger, fluidicly couples a corresponding plurality of pumps to each other in series. Accordingly, should one of the plurality of pumps fail (e.g., become inoperable or insufficiently operable), the remaining pump(s) can cause the working fluid to continue flowing through the respective heat exchange element.

When coupled to each other in series, a heat exchange module positioned downstream of another heat exchange module will typically receive a relatively higher-temperature working fluid (e.g., working fluid that absorbed heat as it passed through the upstream heat exchange module) as compared to heat exchange modules fluidicly coupled to each other in parallel. Nonetheless, since the mixed mean temperature of the working fluid as it exhausts from the upstream heat exchange module corresponds, at least in part, to the mean flow rate of the working fluid through the upstream heat exchange module, a suitable flow rate of the working fluid can be selected to maintain a temperature of the working fluid below a predetermined threshold temperature. As an example, the threshold temperature can correspond, at least in part, to a rate of cooling provided by the downstream heat exchange module.

When two heat exchange modules 120a", 130a" are coupled to each other in parallel, e.g., as shown in FIG. 6A, the working fluid can pass from each heat exchange module 120a", 130a" into the collection manifold 220 without passing through the other heat exchange module. For example, an inlet to each heat exchange module 120a", 130a" can be fluidicly coupled to the distribution manifold 210, and a corresponding stream of working fluid can pass through each of the heat exchange modules. The respective streams can mix with each other in a manifold (e.g., the collection manifold). Although coupling heat exchange modules to each other in parallel does not provide redundant pumping (as series coupling provides), each respective stream of working fluid can pass through the parallel heat exchange modules without being heated by other of the heat exchange modules coupled in parallel.

Fluid Distribution

Many liquid-phase working fluids are substantially incompressible liquids. Accordingly, one or more pumps configured to increase a pressure head in the working fluid, and thereby to urge the working fluid through the fluid circuit extending between and passing through the environmental coupler 15 and the equipment module 100, can be positioned in any suitable or convenient location within the circuit, as described more fully below.

A given heat-transfer element 110a, 110b . . . 110n can include one or more pumps configured to increase a pressure head of the working fluid as the working fluid passes through the heat-transfer element. The pumps can be fluidicly coupled to each other in series or in parallel.

Compared to a single pump, pumps coupled to each other in series tend to provide a relatively larger increase in pressure head at about the same flow rate, as measured between an inlet to an upstream pump and an outlet of a downstream pump. Compared to a single pump, pumps coupled to each other in parallel tend to provide a relatively larger flow rate, cumulatively, at about the same increase in pressure head.

Some heat-transfer elements have one pump and a plurality of heat exchange modules. As explained above in relation to FIG. 6 and FIG. 6A, the plurality of heat exchanger modules can be fluidicly coupled to each other in series or in parallel. The plurality of heat exchange modules can be fluidicly coupled to the pump in series (e.g., positioned upstream or downstream of the pump).

Other heat-transfer elements have a plurality of pumps and a plurality of heat exchangers fluidicly coupled to each other. The plurality of pumps can be fluidicly coupled to each other in parallel or in series, and the heat exchange modules can be fluidicly coupled to each other in parallel or in series. One or more in the plurality of heat exchangers can be fluidicly coupled in parallel or in series with one or more of the plurality of pumps.

For example, a first plurality of heat exchange modules can be fluidicly coupled to each other in parallel or in series. The first plurality of heat exchange modules can be fluidicly coupled to a corresponding first plurality of pumps in series (e.g., positioned upstream or downstream of the pumps). The first plurality of pumps can be fluidicly coupled to each other in parallel or in series. A second plurality of heat exchange modules can be fluidicly coupled to each other in parallel or in series. The second plurality of heat exchangers can be fluidicly coupled to a second plurality of pumps in series (e.g., positioned upstream or downstream of the pumps). The respective first and second pluralities of pumps can be fluidicly coupled to each other in parallel or in series.

Plural heat-transfer elements 110a, 110b . . . 110n corresponding to a given equipment module 100 can be fluidicly coupled to each other in series or in parallel. By way of example, FIGS. 1, 2, 3, 5 and 6 show representative embodiments of a plurality of heat-transfer elements 110a, 110b . . . 110n fluidicly coupled with each other in parallel. As explained above, each of the heat-transfer elements, in turn, can have a plurality of heat exchange modules fluidicly coupled to each other in series (or in parallel).

As FIG. 6 shows, the respective inlets 150a, 150b . . . 150n to each of the heat-transfer elements 110a, 110b . . . 110n can be fluidicly coupled to the distribution manifold 210, and the respective outlets 140a, 140b . . . 140n of each of the heat-transfer elements can be fluidicly coupled to the collection manifold 220. With such a parallel configuration of heat-transfer elements 110a, 110b . . . 110n, a given mass of working fluid can pass through one heat-transfer element without passing through another heat-transfer element.

Such a parallel configuration reduces thermal coupling among the servers 112a, 112b . . . 112n by preventing a given mass of working fluid that has passed through one heat transfer element from passing through another heat transfer element until absorbed heat can be rejected from the working fluid (e.g., in the coolant heat exchange module). As well, such a configuration allows the pump(s) in the plural heat-transfer elements 110a, 110b . . . 110n to urge the working fluid throughout the equipment heat exchange module 12, which can eliminate or reduce the need for pumps apart from those within the heat-transfer elements.

Nonetheless, some embodiments of disclosed heat exchange systems include a "system" pump positioned within the fluid distribution circuit and spaced from the component heat exchange modules, e.g., modules 120a, 130a. For example, a pump can be positioned in series between the manifold module 200 and the environmental coupler 15 (e.g., in the fluid heat exchange module 300). As but one example, the coolant heat exchange module shown in FIG. 6B includes a pump 317 positioned downstream of the reservoir 315 (although, the pump can be positioned upstream of the reservoir in other embodiments).

Even so, fluidicly coupling the heat-transfer elements in parallel with each other provides a measure of redundancy that otherwise would be unavailable if a pump was positioned in, for example, the working fluid heat exchange module 300. For example, if a given heat-transfer element fails or otherwise degrades in performance, the degraded heat-transfer element and any associated operable elements (e.g., a server) can be removed from the equipment heat exchange module 100 (and the associated rack) without affecting the operation of any remaining heat-transfer elements or operable elements.

As well, if one of the pumps in a given heat-transfer element fails, the other pump(s) in the heat-transfer element can continue to urge the working fluid through the heat-transfer element (e.g., through the respective heat exchange modules), allowing the working fluid to continue to exchange heat with each operable element in thermal contact with a respective component heat exchange module until the heat-transfer element 110a can be repaired or replaced.

Additionally, fluidicly coupling the heat exchange modules in a given heat-transfer element, e.g., 110a, with each other in series allows the flow-rate through the respective heat-transfer element to be selected to correspond with a desired rate of heat transfer through the heat exchange modules. For example, if a heat exchanger is thermally coupled with a heat dissipating device and a relatively higher rate of heat transfer from the device into the working fluid is desired, a relatively higher flow rate of the working fluid can be provided by, for example, increasing the speed of one or more of the respective pumps in the given heat-transfer element 110a.

Heat-transfer elements having independently controllable pumps and being fluidicly coupled to each other in parallel also allows a flow rate through each respective heat-transfer element 110a, 110b . . . 110n to be controlled independently of the other heat-transfer elements. Such independent control of working-fluid flow rates through each respective heat-transfer element 110a, 110b . . . 110n allows the power consumed by the respective working elements to be selected to correspond to a desired rate of heat transfer to or from each respective heat-transfer element. For example, selecting a suitably low power for each respective heat-transfer element in the plurality of heat-transfer elements 110a, 110b . . . 110n can provide a relatively lower overall power consumption for the equipment module 100 than if each heat-transfer element had an identical flow rate to the other heat-transfer elements (e.g., corresponding to the highest rate of heat transfer for an operable element in an array of operable elements), particularly when the desired rates of heat transfer to or from each heat-transfer element varies substantially among the plurality of heat-transfer elements.

Fluid Couplers

As used herein, "fluidic" means of or pertaining to a fluid (e.g., a gas, a liquid, a mixture of a liquid phase and a gas phase, etc.). Thus, two regions that are "fluidicly coupled" are so coupled to each other as to permit a fluid to flow from one of the regions to the other region in response to a pressure gradient between the regions.

Figure 5:
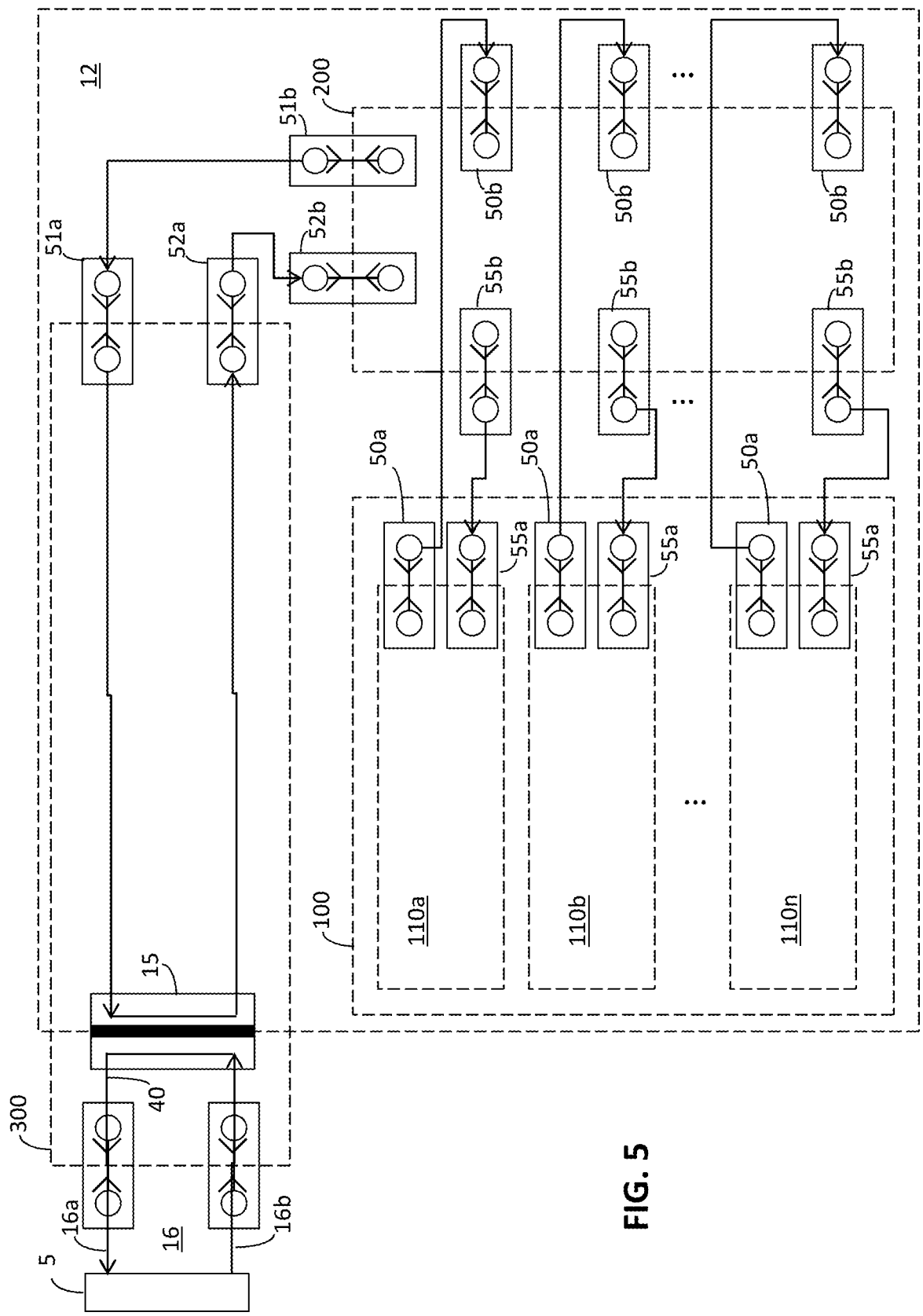
FIG. 5 shows a schematic illustration of the modular heat-transfer system shown in FIGS. 1 and 2, with features of the heat-transfer elements and several corresponding fluid couplers shown.

As indicated in FIG. 5, one or more of the fluid conduits 20, 30, 40 that fluidicly couple one module to another module (e.g., the equipment module 100 to the manifold module 200, or the manifold module to the coolant heat-exchange module 300) can be coupled to one or both of the respective modules by a decoupleable coupler (e.g., couplers 50, 50a, 50b, 51a, 52a, 52b, 55a, 55b). Some decouplable couplers are configured as dripless quick-connect couplers of the type commercially available from Colder Products Company.

As FIG. 6 indicates, the fluid conduit 162a, 162b . . . 162n extending from the respective inlets 150a, 150b . . . 150n to the heat-transfer elements 110a, 110b . . . 110n can have an inlet fluid coupler 230a, 230b . . . 230n positioned at a distal end of the fluid conduit. The inlet fluid coupler 230a, 230b . . . 230n can be configured to couple the respective fluid conduit to the distribution manifold 210. Similarly, the fluid conduit 172a, 172b . . . 172n extending from the respective outlet 140a, 140b . . . 140n of the heat-transfer elements 110a, 110b . . . 110n can have an outlet fluid coupler 240a, 240b . . . 240n positioned at a distal end of the fluid conduit. The outlet fluid coupler 240a, 240b . . . 240n can be configured to couple the respective fluid conduits to the collection manifold 220.

In some embodiments, each respective inlet fluid coupler 230a, 232b . . . 230n is configured sufficiently differently from the respective outlet fluid couplers 240a, 240b . . . 240n so as not to be interchangeable with each other. Such non-interchangeable inlet and outlet fluid couplers can reduce the likelihood that a user might inadvertently connect an inlet fluid coupler to the collection manifold 220 or an outlet fluid coupler to the distribution manifold 210. Each of the respective fluid couplers can be configured as a dripless quick connect coupler, as described above.

Component heat-exchange modules 120a, 130a can be instrumented with one or more sensors configured to observe a relevant physical parameter associated with the respective heat exchange module and to emit a signal corresponding to the observed physical parameter. Signals emitted by such a sensor can be conveyed wirelessly to a receiver or on a wire to a bus. As described below, the manifold module 200 can include such a bus, and a signal wire extending from and corresponding to one or more sensors relating to each heat exchange module can be electrically coupled to such a bus, as by matingly engaging an electrical connector element on the wire with an electrical connector element on the bus.

Manifold Module

As noted above and shown in FIG. 7, a manifold module 200 can have a distribution manifold and/or a collection manifold. The manifold module 200 can include a body, or member, defining an elongate bore defining a manifold. The elongate bore can terminate within the body, defining an elongate recess having an opening 211, 221 at one end. A plurality of transverse bores can extend inwardly of the construct and intersect the elongate bore, defining a plurality of transverse openings to the elongate bore. The construct can be formed of any suitable material or combination of materials. In some embodiments, the construct can have a unitary construction, and in other embodiments, the construct has a multi-piece construction.

The elongate bore can define a distribution manifold 210 configured to distribute a flow of a working fluid among a plurality of heat-transfer elements 110a, 110b . . . 110n. For example, the opening 211 at the end of the elongate recess can define a fluid inlet, and each of the plurality of transverse openings 231a, 231b . . . 231n can define a respective fluid outlet. An inlet to each respective heat-transfer element 110a, 110b . . . 110n can be fluidicly coupled to a corresponding one of the transverse openings. With such a configuration, each of the heat-transfer elements can be fluidicly coupled to the other heat-transfer elements in parallel.

The elongate bore can define a collection manifold 220 configured to collect a flow of a working fluid among the plurality of heat-transfer elements. For example, the opening at the end of the elongate recess can define a fluid outlet 221, and each of the plurality of transverse openings 242a, 242b . . . 242n can define a respective fluid inlet to the collection manifold. An outlet of each respective heat-transfer element 110a, 110b . . . 110n can be fluidicly coupled to a corresponding one of the transverse openings. With such a configuration, each of the heat-transfer elements is fluidicly coupled to the other heat-transfer elements in parallel.

In some instances, a given member can define a first elongate bore configured as a distribution manifold and a second elongate bore configured as a collection manifold. Such a construct is sometimes referred to as a manifold module 200. The construct can be formed of any suitable material or combination of materials. In some embodiments, the construct can have a unitary construction, and in other embodiments, the construct has a multi-piece construction.

Each opening 211, 221, 231, 241 in the manifold module can have a corresponding fluid coupler 332, 311, 230, 240. Each respective fluid coupler can be configured as a dripless quick connect coupler of the type described above.

As noted above, the fluid couplers corresponding to the distribution manifold 210 and the fluid couplers corresponding to the collection manifold 220 can be configured sufficiently differently from each other so as not to be interchangeable with each other (e.g., they can be "keyed" differently from each other). Such non-interchangeable distribution and collection fluid couplers can reduce the likelihood that a user might inadvertently couple an inlet to a heat-transfer element to the collection manifold and an outlet from a heat-transfer element to the distribution manifold.

Coolant Heat-Exchange Module

In the context of a cooling system for rack mountable servers, an environmental coupler can have a coolant heat-exchange module. Suitable coolant heat exchange modules can be passive (e.g., the coolant heat exchange module 300, shown in FIG. 6) or active (e.g., can include a "system" pump, as shown by way of example in FIG. 6B).

Figure 9:
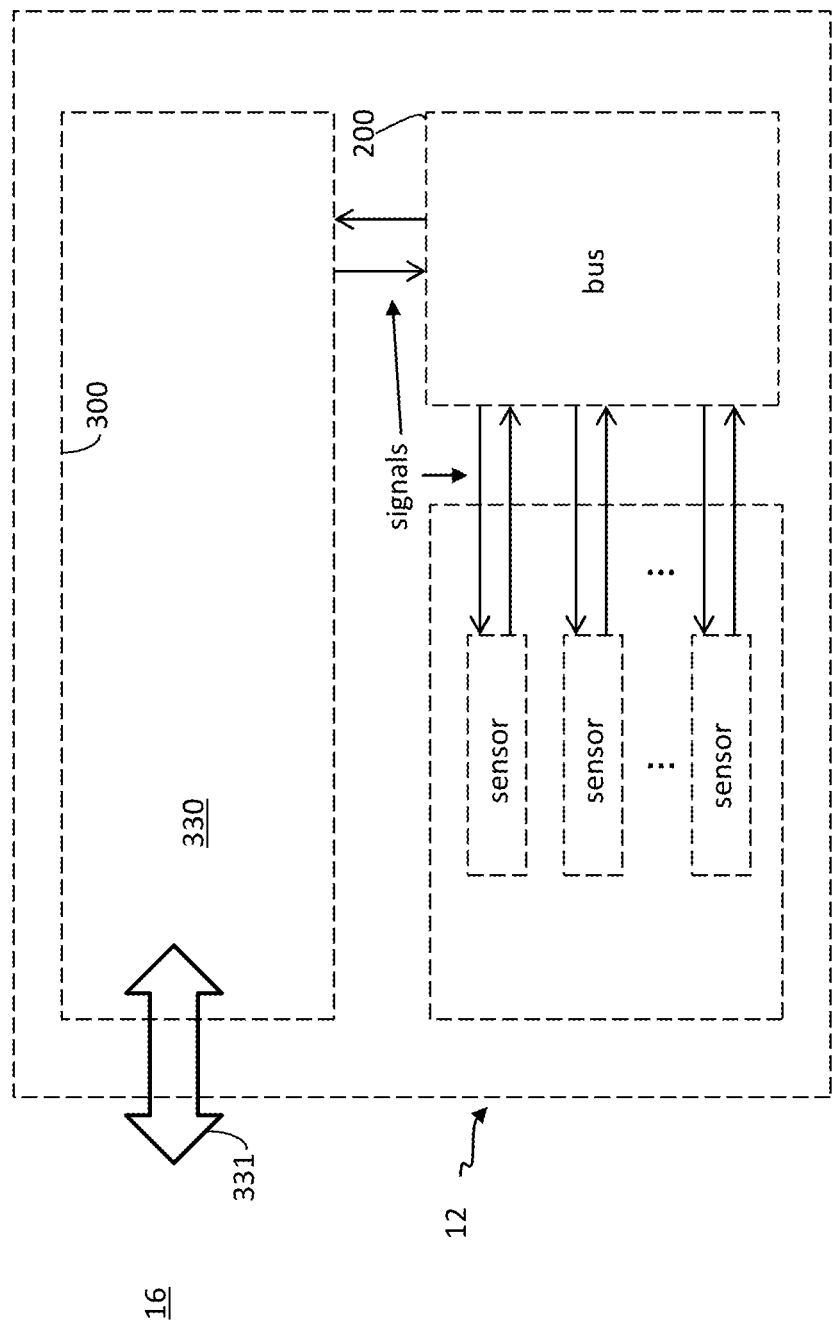
FIG. 9 shows a block diagram of a controller suitable for controlling a modular heat-transfer system of the type shown in FIG. 1.

As shown in FIGS. 1, 5 and 9, the coolant heat-exchange module 300 can be configured to exchange heat between the equipment heat-transfer module 12 and an environment 16. For example, the coolant heat-exchange module 300 can have an environmental coupler 15 configured to exchange heat between a working fluid in the equipment heat-transfer module 12 and an environmental working fluid, such as, for example, a facility's water supply 162, 16b.

Referring to FIG. 6, an inlet 310 to the coolant heat-exchange module 300 can be fluidicly coupled to an outlet 321 from the collection manifold 320. An inlet 315a to a working-fluid reservoir 315 can be fluidicly coupled downstream of the inlet 310, and an outlet 315b from the reservoir 315 can be fluidicly coupled to an inlet 316a to a stop valve 316, sometimes also referred to as a shut-off valve. (The shut-off valve can be closed to prevent the working fluid from being pumped out of or draining from the equipment heat-transfer module 12, e.g., in the event of a leak.)

The environmental coupler 15 can be configured as a plate heat exchanger or as any other suitable liquid-liquid heat exchanger. For example, a first inlet 321a to the environmental coupler 15 (e.g., a plate heat exchanger) can be fluidicly coupled to the outlet 316b of the stop valve 316. A first fluid conduit 321 can extend between the first inlet 321a to the environmental coupler 15 and a first outlet 321b from the environmental coupler, allowing the working fluid from the equipment heat exchange module 12 to pass through the environmental coupler 15 and exchange heat with, e.g., an environmental fluid passing through a second conduit 322 in the coupler 15.

Figure 8:
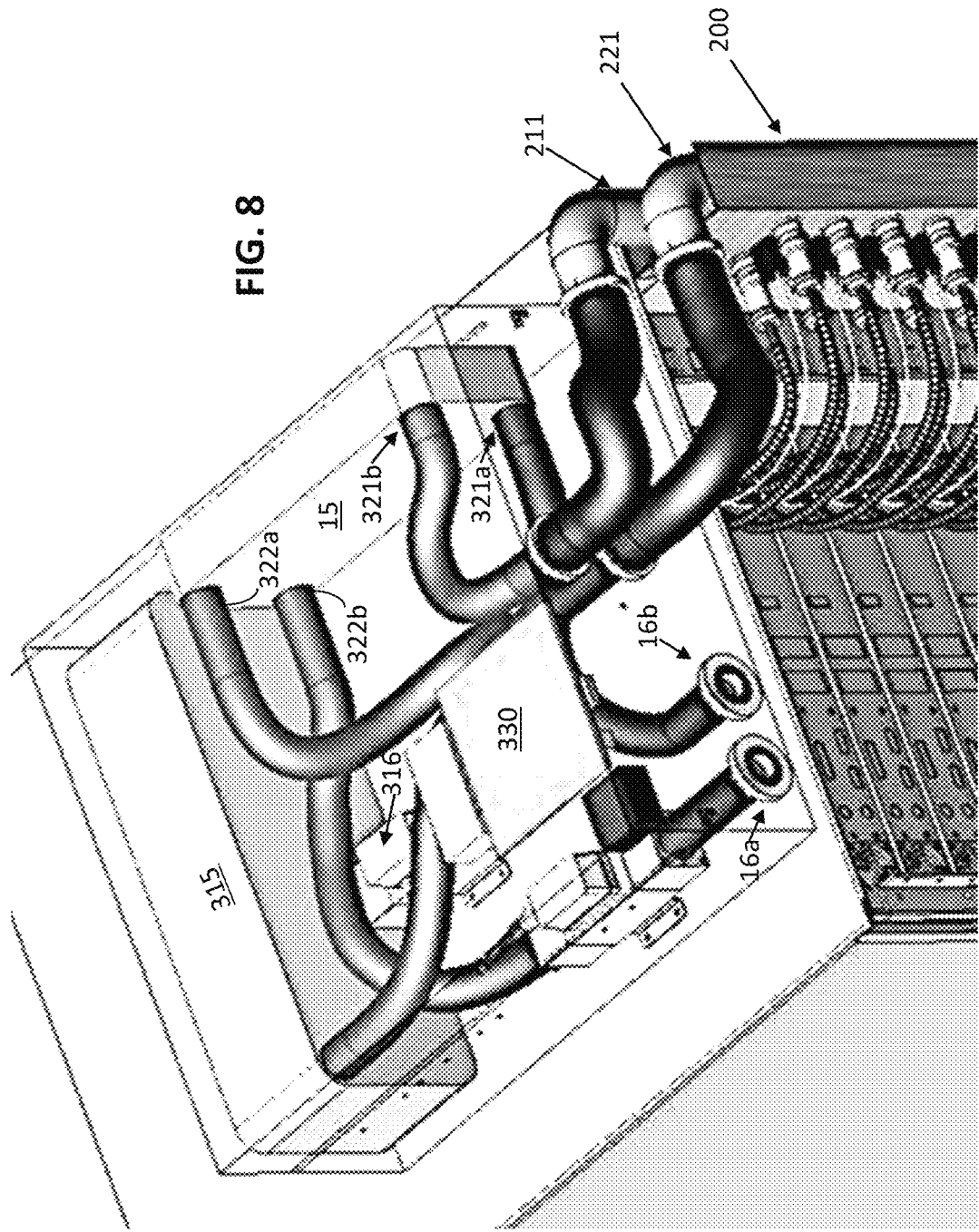
FIG. 8 shows an isometric view of a portion of the modular heat-transfer system shown in FIG. 1, with features of the environmental coupler shown.

A second inlet 322a to the environmental coupler 15 can be fluidicly coupled to a supply 16b (FIGS. 1, 5 and 8) of an environmental working fluid (e.g., a cool-water source). The second fluid conduit 322 can extend between the second fluid inlet 322a and a second outlet 322b, allowing the environmental working fluid to pass through the environmental 15 coupler and exchange heat with the working fluid of the equipment heat exchange module 12.

The first outlet 321b (e.g., corresponding to the working fluid of the equipment heat-exchange module 12) can be fluidicly coupled to a check valve 325 (325a, 325b). The check valve 325 can prevent the working fluid in the equipment heat exchange module 12 from reversing a flow direction.

A proportional valve (not shown) can control a flow rate of the environmental working fluid, controlling the rate at which the environmental working fluid is permitted to flow through the environmental coupler 15. Thus, the proportional valve can control a rate of heat transfer between the equipment heat exchange module 12 and the environmental working fluid. As well, the respective pumps in the equipment heat exchange module 12 can be controlled to increase or decrease the flow of working fluid through the environmental coupler 15 and thereby control a rate of heat transfer with the environmental working fluid.

Controlling the flow rate of each respective working fluid through the environmental coupler 15 can also effectively control a temperature (e.g., a temperature of an exposed surface) of the environmental coupler. By controlling a temperature of the environmental coupler 15, a user can prevent, or substantially prevent, condensation from forming on or around the environmental coupler 15 by maintaining the temperature of the environmental coupler above the dew point.

PERFORMANCE EXAMPLES

Presently disclosed systems can provide unrivalled cooling capacity and cost savings. For example, some disclosed systems can outperform other liquid cooling solutions in today's data center market segment by a considerable margin. Recent testing has shown that presently disclosed systems can provide a number of unprecedented benefits in the data center environment, from decreased operating expenditures to facilitating increased rack densities. For example,
1. A flow rate of less than about 5 L/min (e.g., between about 4.5 L/min and about 5.5 L/min) of about 10 C (e.g., between about 9 C and about 11 C) facility water: presently disclosed systems represent the first liquid cooling solution to be so effective that even at less than about 5 L/min, more than about 10 kW (e.g., between about 9 kW and about 11 kW) of total CPU power can be suitably cooled. This represents dramatic reductions in facility water usage and represents substantial cost savings compared to water usage and operating costs associated with conventional liquid cooling systems.
2. A flow rate of about 30 L/min (e.g., between about 27 L/min and about 33 L/min) of about 10 C facility water: presently disclosed systems can facilitate unparalleled cooling of high rack densities, e.g., more than about 45 kW (e.g., between about 40 kW and about 50 kW) of heat can be dissipated at a relatively low flow rate of about 30 L/min.
3. A flow rate of about 30 L/min of about 50 C (e.g., between about 45 C and about 50 C) facility water: presently disclosed systems can provide suitable cooling using relatively low flow rates and relatively hot water compared to conventional liquid cooling systems, e.g., some presently disclosed systems can suitably cool more than about 10 kW per rack with relatively hot water (e.g., water at a temperature of about 50 C) using a flow rate of less than about 30 L/min. This translates to incredible operational cost savings, including by elimination of chillers (representing up to about 35% of total cooling costs), free-air cooling, throttled down CRAC/CRAH systems, and less reliance on server fans.

The unparalleled cooling performance of presently disclosed systems can allow a combination of increased density and decreased power usage that suit the specific needs of data center environment.

Facility water 16b at 40° C. can be obtained in most climates with an economizer and without any supplemental refrigeration, chilling or cooling towers, eliminating a substantial source of power consumption that most conventional data centers must live with when relying on conventional cooling technologies.

In another example, 77% of the power consumed by air cooling a 95 Watt thermal-design-power processor was eliminated when the processor was cooled to the same temperature with a heat exchange module of the type described above. In this example, 14 Watts of power consumed by the conventional cooling system was eliminated, eliminating about 5% of the total power consumed by the operable server (e.g., as measured at an input to the server's power supply).

The cooling techniques described above greatly improve the cooling density that can be achieved for rack-mounted servers. Improved cooling density, in turn, allows greater computational capacity within a given volume, and improves the cost-effectiveness and performance of a given physical location. Moreover, cooling heat sources in servers using liquid cooling, the sources can be cooled independently of the air in a data center, reducing the load on the room air conditioning and eliminating a source of large expenses associated with operating a conventional data center.

Table 1, below, summarizes several examples of cooling performance that can be achieved using modular heat-transfer systems of the type disclosed herein. Surprisingly, some modular systems have achieved a case-to-coolant thermal resistance of about −0.056° C./W. Such a surprisingly low thermal resistance is adequate for cooling two 150 Watt microprocessors in a 1U server without requiring any chilling or refrigeration of a facility's water source. For example, with such a low thermal resistance, facility water entering the environmental coupler 15 at 40° C. is capable of cooling the two microprocessors to 51.5° C. and 55.1° C., respectively.

The data shown in Table 1, below, is for a single heat-transfer element 110a having two heat exchange modules of the type disclosed in the '379 Application fluidically coupled to each other in series, as described above. Each of the heat exchange modules was thermally coupled to a respective one of the microprocessors.

| Variables | | Calculated Parameters | |
|---|---|---|---|
| Facility Water Temperature = 20° C. | | | |
| Facility | | | |
| Facility Inlet Liquid Temperature (° C.) | 20.0 | Facility Outlet Liquid Temperature (° C.) | 27.2 |
| Facility Cooling Water Supply Flow (L/min) | 25.2 | | |
| Rack | | | |
| Plate Heat Exchanger Thermal Resistance (° C./W) | 0.00032 | Total Power (W) | 12600 |
| Serves per Rack | 42 | Manifold Outlet Coolant Temperature (° C.) | 31.2 |
| | | Total Rack Coolant Flow (L/min) | 25.2 |
| Server | | | |
| CPU Power (W) | 150 | Server Inlet Coolant Temperature (° C.) | 24.0 |
| CPUs per Server | 2 | CPU 1 Cap (° C.) | 31.5 |

| Variables | | Calculated Parameters | |
|---|---|---|---|
| ECO 2 Flow Rate (L/min) | 0.60 | CPU 2 Cap (° C.) | 35.1 |
| Cap to Coolant Thermal Resistance | 0.050 | | |
| Facility Water Temperature = 30° C. | | | |
| Facility | | | |
| Facility Inlet Liquid Temperature (° C.) | 30.0 | Facility Outlet Liquid Temperature (° C.) | 37.2 |
| Facility Cooling Water Supply Flow (L/min) | 25.2 | | |
| Rack | | | |
| Plate Heat Exchanger Thermal Resistance (° C./W) | 0.00032 | Total Power (W) | 12600 |
| Serves per Rack | 42 | Manifold Outlet Coolant Temperature (° C.) | 41.2 |
| | | Total Rack Coolant Flow (L/min) | 25.2 |
| Server | | | |
| CPU Power (W) | 150 | Server Inlet Coolant Temperature (° C.) | 34.0 |
| CPUs per Server | 2 | CPU 1 Cap (° C.) | 41.5 |
| ECO 2 Flow Rate (L/min) | 0.60 | CPU 2 Cap (° C.) | 45.1 |
| Cap to Coolant Thermal Resistance | 0.050 | | |
| Facility Water Temperature = 40° C. | | | |
| Facility | | | |
| Facility Inlet Liquid Temperature (° C.) | 40.0 | Facility Outlet Liquid Temperature (° C.) | 47.2 |
| Facility Cooling Water Supply Flow (L/min) | 25.2 | | |
| Rack | | | |
| Plate Heat Exchanger Thermal Resistance (° C./W) | 0.00032 | Total Power (W) | 12600 |
| Serves per Rack | 42 | Manifold Outlet Coolant Temperature (° C.) | 51.2 |
| | | Total Rack Coolant Flow (L/min) | 25.2 |
| Server | | | |
| CPU Power (W) | 150 | Server Inlet Coolant Temperature (° C.) | 44.0 |
| CPUs per Server | 2 | CPU 1 Cap (° C.) | 51.5 |
| ECO 2 Flow Rate (L/min) | 0.60 | CPU 2 Cap (° C.) | 55.1 |
| Cap to Coolant Thermal Resistance | 0.050 | | |

System Monitors and Controllers

As shown in FIG. 9, some disclosed modular heat-transfer systems 12 include one or more sensors 210a, 210b . . . 210n configured to monitor one or more respective physical parameters of the system, or an environment 16. Also, some disclosed modular heat-transfer systems 12 include a controller configured to adjust one or more operating parameters of the system at least partially responsively to a signal emitted by a sensor. Some disclosed control systems include a computing environment of the type shown in FIG. 10. Some computing environments comprise a server being cooled by the modular heat-transfer system.

Some disclosed modular heat-transfer systems 10 include one or more sensors configured to monitor one or more corresponding physical parameter of the system. Such sensors can include, among others, a temperature sensor so positioned relative to a fluid conduit (e.g., a conduit 20, 30, 40) as to provide a signal corresponding to a temperature of a fluid within the conduit or a temperature of a surface of a component heat-exchange module 120a, 120b (FIG. 2), a pressure sensor so positioned as to provide a signal corresponding to a relative pressure difference between a static pressure in a working fluid and a selected reference pressure, a speed sensor (e.g., a tachometer) configured to provide a signal corresponding to a rotational speed of a pump, a float sensor or other sensor configured to provide a signal corresponding to a coolant level in a reservoir, and a humidity sensor configured to provide a signal corresponding to one or more of an absolute humidity, a relative humidity, a wet-bulb temperature and a dry-bulb temperature. Such signals can include any type of signal suitable for conveying information, including wired and wireless signals, e.g., radio frequency (RF), infrared (IR), microwave and photonic signals.

Some disclosed coolant heat-exchange modules 300 include a controller 330. For example, such a controller 330 can be configured to adjust one or more operating parameters of a corresponding modular heat-transfer system 10 at least partially responsive to a signal emitted by a sensor in response to a detected measurement of a physical parameter, e.g., of the system or of the environment. Such a controller 330 can also be configured to emit a signal 331 (FIG. 9) containing information related to a sensed operational parameter of the system 10. Such an emitted signal can be received by a remote receiver (or by a server being cooled by the system 10), and an administrator can be alerted when an observed operational parameter falls outside of a selected range (e.g., when an over temperature condition is detected).

In some instances, the working fluid heat exchanger module can include a stop valve 316 being electrically actuatable between an open and a closed position. The valve 316 can be configured to prevent circulation of the working fluid among the coolant heat-exchange module 300, the manifold module 200 and the array 100 of heat-transfer elements 110a, 110b . . . 110n when the valve is in the closed position.

The valve 316 can be operatively coupled to the controller. For example, the controller can be capable of actuating the valve by transmitting an actuation signal to the valve. The actuation signal can be transmitted at least partially responsively to a signal emitted by one or more of the sensors (e.g., a leak detector, a dew-point sensor).

Figure 10:
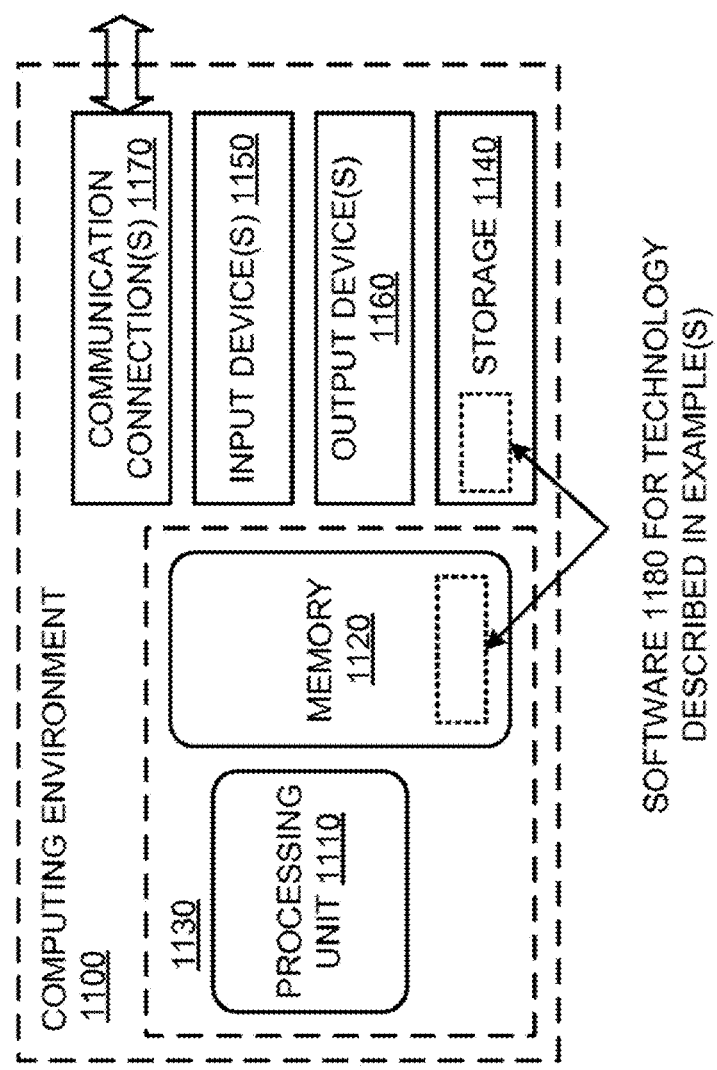
FIG. 10 shows a block diagram of a computing environment suitable for use in combination with a controller as shown in FIG. 9.

Some disclosed modular heat-transfer systems include a computing environment, as shown in FIG. 10. Some computing environments are configured to translate an electrical or other signal from a sensor into a user-recognizable form (e.g., by presenting a graphical display of a temperature, a pressure or a pump speed, or by invoking an audible alarm). Some computing environments are configured as a controller for adjusting one or more operating parameters of the modular heat-transfer system, as described above. In the context of rack-mountable servers, such a computing environment can include one or more of the servers being cooled by the respective heat-transfer elements.

Computing Environments

FIG. 10 illustrates a generalized example of a suitable computing environment 1100 in which described methods, embodiments, techniques, and technologies may be implemented. The computing environment 1100 is not intended to suggest any limitation as to scope of use or functionality of the technology, as the technology may be implemented in diverse general-purpose or special-purpose computing environments. For example, the disclosed technology may be implemented with other computer system configurations, including hand held devices, multiprocessor systems, microprocessor-based or programmable consumer electronics, network PCs, minicomputers, mainframe computers, and the like. The disclosed technology may also be practiced in distributed computing environments where tasks are performed by remote processing devices that are linked through a communications network. In a distributed computing environment, program modules may be located in both local and remote memory storage devices.

With reference to FIG. 10, the computing environment 1100 includes at least one central processing unit 1110 and memory 1120. In FIG. 10, this most basic configuration 1130 is included within a dashed line. The central processing unit 1110 executes computer-executable instructions and may be a real or a virtual processor. In a multi-processing system, multiple processing units execute computer-executable instructions to increase processing power and as such, multiple processors can be running simultaneously. The memory 1120 may be volatile memory (e.g., registers, cache, RAM), non-volatile memory (e.g., ROM, EEPROM, flash memory, etc.), or some combination of the two. The memory 1120 stores software 1180 that can, for example, implement one or more of the innovative technologies described herein. A computing environment may have additional features. For example, the computing environment 1100 includes storage 1140, one or more input devices 1150, one or more output devices 1160, and one or more communication connections 1170. An interconnection mechanism (not shown) such as a bus, a controller, or a network, interconnects the components of the computing environment 1100. Typically, operating system software (not shown) provides an operating environment for other software executing in the computing environment 1100, and coordinates activities of the components of the computing environment 1100.

The storage 1140 may be removable or non-removable, and includes magnetic disks, magnetic tapes or cassettes, CD-ROMs, CD-RWs, DVDs, or any other medium which can be used to store information and which can be accessed within the computing environment 1100. The storage 1140 stores instructions for the software 1180, which can implement technologies described herein.

The input device(s) 1150 may be a touch input device, such as a keyboard, keypad, mouse, pen, or trackball, a voice input device, a scanning device, or another device, that provides input to the computing environment 1100. For audio, the input device(s) 1150 may be a sound card or similar device that accepts audio input in analog or digital form, or a CD-ROM reader that provides audio samples to the computing environment 1100. The output device(s) 1160 may be a display, printer, speaker, CD-writer, or another device that provides output from the computing environment 1100.

The communication connection(s) 1170 enable communication over a communication medium (e.g., a connecting network) to another computing entity. The communication medium conveys information such as computer-executable instructions, compressed graphics information, or other data in a modulated data signal. The data signal can include information pertaining to a physical parameter observed by a sensor or pertaining to a command issued by a controller, e.g., to invoke a change in an operation of a component in the system 10 (FIG. 1).

Computer-readable media are any available media that can be accessed within a computing environment 1100. By way of example, and not limitation, with the computing environment 1100, computer-readable media include memory 1120, storage 1140, communication media (not shown), and combinations of any of the above.

OTHER EXEMPLARY EMBODIMENTS

The examples described above generally concern modular heat-transfer systems configured to exchange heat between a region of relatively higher temperature and a region of relatively lower temperature. Other embodiments than those described above in detail are contemplated based on the principles disclosed herein, together with any attendant changes in configurations of the respective apparatus described herein. Incorporating the principles disclosed herein, it is possible to provide a wide variety of modular systems configured to transfer heat. For example, disclosed systems can be used to transfer heat to or from components in a data center, laser components, light-emitting diodes, chemical reactions, photovoltaic cells, solar collectors, and a variety of other industrial, military and consumer devices now known and hereafter developed. Moreover, systems disclosed above can be used in combination with other heat-transfer systems, such as thermoelectric coolers, refrigeration systems, and systems using air cooling of peripheral components, as but several from among many possible examples.

Directions and references (e.g., up, down, top, bottom, left, right, rearward, forward, etc.) may be used to facilitate discussion of the drawings but are not intended to be limiting. For example, certain terms may be used such as "up," "down,", "upper," "lower," "horizontal," "vertical," "left," "right," and the like. Such terms are used, where applicable, to provide some clarity of description when dealing with relative relationships, particularly with respect to the illustrated embodiments. Such terms are not, however, intended to imply absolute relationships, positions, and/or orientations. For example, with respect to an object, an "upper" surface can become a "lower" surface simply by turning the object over. Nevertheless, it is still the same surface and the object remains the same. As used herein, "and/or" means "and" or "or", as well as "and" and "or." Moreover, all patent and non-patent literature cited herein is hereby incorporated by references in its entirety for all purposes.

The principles described above in connection with any particular example can be combined with the principles described in connection with any one or more of the other examples. Accordingly, this detailed description shall not be construed in a limiting sense, and following a review of this disclosure, those of ordinary skill in the art will appreciate the wide variety of fluid heat exchange systems that can be devised using the various concepts described herein. Moreover, those of ordinary skill in the art will appreciate that the exemplary embodiments disclosed herein can be adapted to various configurations without departing from the disclosed principles.

The previous description of the disclosed embodiments is provided to enable any person skilled in the art to make or use the disclosed innovations. Various modifications to those embodiments will be readily apparent to those skilled in the art, and the generic principles defined herein may be applied to other embodiments without departing from the spirit or scope of this disclosure. Thus, the claimed inventions are not intended to be limited to the embodiments shown herein, but are to be accorded the full scope consistent with the language of the claims, wherein reference to an element in the singular, such as by use of the article "a" or "an" is not intended to mean "one and only one" unless specifically so stated, but rather "one or more". All structural and functional equivalents to the elements of the various embodiments described throughout the disclosure that are known or later come to be known to those of ordinary skill in the art are intended to be encompassed by the features described and claimed herein. Moreover, nothing disclosed herein is intended to be dedicated to the public regardless of whether such disclosure is explicitly recited in the claims. No claim element is to be construed under the provisions of 35 USC 112, sixth paragraph, unless the element is expressly recited using the phrase "means for" or "step for".

Thus, in view of the many possible embodiments to which the disclosed principles can be applied, it should be recognized that the above-described embodiments are only examples and should not be taken as limiting in scope. We therefore reserve all rights to the subject matter disclosed herein, including the right to claim all that comes within the scope and spirit of the foregoing description.

The invention claimed is:

1. A modular cooling system comprising:
a liquid-liquid heat exchanger defining a first flow path and a second flow path, wherein the first flow path and the second flow path are thermally coupled with each other and fluidly isolated from each other, wherein the first flow path has a corresponding inlet and a corresponding outlet;
a closed liquid circuit configured to circulate a liquid, the closed liquid circuit comprising
a plurality of heat-transfer elements, wherein each heat-transfer element has a component heat-exchange module, wherein each component heat-exchange module has an integrated pump and heat-sink, wherein each respective heat-sink is configured to conductively receive heat from a corresponding electronic component and to transfer the received heat to the liquid in the respective component heat-exchange module;
a distribution manifold fluidly coupling the outlet from the first flow path through the liquid-liquid heat exchanger with each respective heat-transfer element; and
a collection manifold fluidly coupling the inlet to the first flow path through the liquid-liquid heat exchanger with each respective heat-transfer element, wherein the integrated pumps of the component heat-exchange modules are the only pumps in the closed liquid circuit configured to urge the liquid to circulate through the closed liquid circuit.

2. A modular cooling system according to claim 1, further comprising a rack configured to receive a plurality of independently operable servers, each having a corresponding one or more of the plurality of heat-transfer elements.

3. A modular cooling system according to claim 2, wherein the rack is further configured to mountably receive one or more of the liquid-liquid heat exchanger, the distribution manifold, and the collection manifold.

4. A modular cooling system according to claim 1, further comprising a sensor configured to emit a signal corresponding to a leak of liquid from the liquid-liquid heat exchanger, the closed liquid circuit, or both.

5. A modular cooling system according to claim 4, further comprising a control apparatus configured to limit a flow of liquid through the first flow path, the second flow path, or both, at least partially responsively to the signal emitted by the sensor.

6. A modular cooling system according to claim 1, further comprising a sensor configured to detect a leak of liquid from the liquid-liquid heat exchanger, the closed liquid circuit, or both.

7. A modular cooling system according to claim 1, further comprising a chassis to mountably receive a plurality of servers, each server having mounted therein or thereon one or more of the plurality of heat-transfer elements, wherein the chassis mountably supports the liquid-liquid heat exchanger, the distribution manifold, and the collection manifold.

8. A modular cooling system according to claim 1, further comprising:
a sensor configured to monitor a condition of the first fluid circuit; and
a controller configured to adjust one or more operating parameters of the modular cooling system at least partially responsively to a signal emitted by the sensor.

9. A modular cooling system according to claim 8, further comprising one or more valves actuatable by the controller, wherein the one or more valves is configured to control a respective flow rate of the first working fluid, the second working fluid, or both, respectively.

10. A modular cooling system according to claim 8, wherein the controller is configured to emit a signal related to a sensed condition indicative of an operational state of the cooling system.

11. A modular cooling system according to claim 8, wherein the sensor is a humidity sensor configured to measure a humidity of ambient air adjacent the liquid-liquid heat-exchanger.

12. A modular cooling system according to claim 11, further comprising:
one or more actuatable valves, wherein the controller comprises
a processor; and
a memory containing instructions that, when executed by the processor, cause the processor to determine a dew point temperature at least partially based on the humidity of ambient air measured by the humidity sensor, wherein the one or more operating parameters comprises an actuation state of at least one of the one or more actuatable valves, wherein the controller is configured to actuate at least one of the one or more actuatable valves at least partially responsively to the dew point temperature determined by the processor being less than a threshold difference from a temperature of a surface of the modular cooling system.

13. A modular cooling system according to claim 12, wherein the threshold difference is selected to prevent condensation from forming on the surface of the modular cooling system.

\* \* \* \* \*